(12) United States Patent
Yu et al.

(10) Patent No.: US 11,646,281 B2
(45) Date of Patent: May 9, 2023

(54) SEMICONDUCTOR STRUCTURES

(71) Applicant: Taiwan Semiconductor Manufacturing Co., Ltd., Hsinchu (TW)

(72) Inventors: Chen-Hua Yu, Hsinchu (TW); Hung-Jui Kuo, Hsinchu (TW); Hui-Jung Tsai, Hsinchu (TW); Tsao-Lun Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/846,413

(22) Filed: Apr. 13, 2020

(65) Prior Publication Data

US 2020/0243465 A1    Jul. 30, 2020

Related U.S. Application Data

(63) Continuation of application No. 15/992,210, filed on May 30, 2018, now Pat. No. 10,622,321.

(51) Int. Cl.
*H01L 23/00* (2006.01)
*H01L 29/06* (2006.01)

(52) U.S. Cl.
CPC .............. *H01L 24/08* (2013.01); *H01L 24/03* (2013.01); *H01L 24/33* (2013.01); *H01L 24/83* (2013.01); *H01L 29/0649* (2013.01); *H01L 2924/186* (2013.01); *H01L 2924/1811* (2013.01)

(58) Field of Classification Search
None
See application file for complete search history.

(56) References Cited

U.S. PATENT DOCUMENTS

| | | | | |
|---|---|---|---|---|
| 6,967,145 B2 * | 11/2005 | Tseng | ................. | B81C 3/002 257/E21.088 |
| 8,426,961 B2 * | 4/2013 | Shih | ................. | H01L 23/5389 257/698 |
| 8,604,615 B2 * | 12/2013 | Lee | ................. | H01L 25/0655 257/734 |
| 9,738,513 B2 * | 8/2017 | Chau | ................. | G01L 9/0052 |
| 10,163,872 B2 * | 12/2018 | Yu | ................. | H01L 25/0657 |
| 10,290,611 B2 * | 5/2019 | Yu | ................. | H01L 24/09 |

(Continued)

FOREIGN PATENT DOCUMENTS

| CN | 102623441 A * | 8/2012 | ........... H01L 21/563 |
|---|---|---|---|
| CN | 105374693 | 3/2016 | |

(Continued)

OTHER PUBLICATIONS

"Office Action of China Counterpart Application", dated Feb. 26, 2021, p. 1-p. 11.

*Primary Examiner* — Telly D Green
(74) *Attorney, Agent, or Firm* — JCIPRNET

(57) ABSTRACT

A semiconductor structure includes a first substrate including a first pad thereover, a second substrate including a bump thereover and a dielectric material. The first pad includes an inner portion and an outer portion being higher than and surrounding the inner portion. The bump is bonded to the inner portion and surrounded by the outer portion. The dielectric material is disposed between the first substrate and the second substrate to encapsulate the first pad and the bump.

20 Claims, 19 Drawing Sheets

(56) References Cited

U.S. PATENT DOCUMENTS

| | | | | |
|---|---|---|---|---|
| 10,833,052 B2 * | 11/2020 | Shih | | H01L 21/486 |
| 2005/0013019 A1 * | 1/2005 | Tseng | | B81C 3/002 |
| | | | | 359/819 |
| 2009/0032893 A1 * | 2/2009 | Weng | | H01L 27/14625 |
| | | | | 257/432 |
| 2009/0244874 A1 * | 10/2009 | Mahajan | | H05K 1/142 |
| | | | | 361/809 |
| 2010/0013081 A1 * | 1/2010 | Toh | | H01L 23/481 |
| | | | | 438/110 |
| 2012/0104624 A1 * | 5/2012 | Choi | | H01L 21/568 |
| | | | | 438/109 |
| 2012/0146177 A1 * | 6/2012 | Choi | | H01L 24/97 |
| | | | | 257/528 |
| 2012/0193779 A1 * | 8/2012 | Lee | | H01L 24/97 |
| | | | | 257/737 |
| 2013/0188103 A1 * | 7/2013 | Jeng | | G06F 3/0412 |
| | | | | 349/12 |
| 2013/0328174 A1 * | 12/2013 | La Tulipe, Jr. | | H01L 25/50 |
| | | | | 257/629 |
| 2014/0159228 A1 * | 6/2014 | Teh | | H01L 23/3114 |
| | | | | 257/734 |
| 2014/0175673 A1 * | 6/2014 | Kim | | H01L 24/73 |
| | | | | 257/777 |
| 2014/0199810 A1 * | 7/2014 | Park | | H01L 25/0657 |
| | | | | 438/107 |
| 2014/0225258 A1 * | 8/2014 | Chiu | | H01L 21/486 |
| | | | | 257/738 |
| 2014/0252572 A1 * | 9/2014 | Hou | | H01L 24/96 |
| | | | | 257/666 |
| 2015/0262989 A1 * | 9/2015 | Kawasaki | | H01L 24/80 |
| | | | | 257/737 |
| 2016/0133571 A1 * | 5/2016 | Lee | | H01L 21/768 |
| | | | | 257/774 |
| 2016/0225692 A1 * | 8/2016 | Kim | | H01L 23/49827 |
| 2016/0236931 A1 * | 8/2016 | Chau | | G01L 9/0073 |
| 2016/0236932 A1 * | 8/2016 | Chau | | B81C 1/00246 |
| 2017/0011993 A1 * | 1/2017 | Zhao | | H01L 23/49811 |
| 2017/0110407 A1 * | 4/2017 | Chaware | | H01L 25/0652 |
| 2017/0117261 A1 * | 4/2017 | Yu | | H01L 23/3107 |
| 2017/0125379 A1 * | 5/2017 | Chen | | H01L 23/49827 |
| 2018/0151392 A1 * | 5/2018 | Chew | | H01L 23/528 |
| 2018/0207681 A1 * | 7/2018 | Chau | | H01L 27/20 |
| 2019/0035767 A1 * | 1/2019 | Yu | | H01L 24/91 |

FOREIGN PATENT DOCUMENTS

| | | | | |
|---|---|---|---|---|
| CN | 105981160 | | 9/2016 | |
| KR | 20120036128 A | * | 4/2012 | ......... H01L 25/0657 |
| KR | 20130123682 A | * | 11/2013 | ......... H01L 25/0657 |
| KR | 101800440 B1 | * | 11/2017 | ......... H01L 23/3135 |
| TW | 201725659 A | * | 7/2017 | ......... H01L 25/0652 |

* cited by examiner

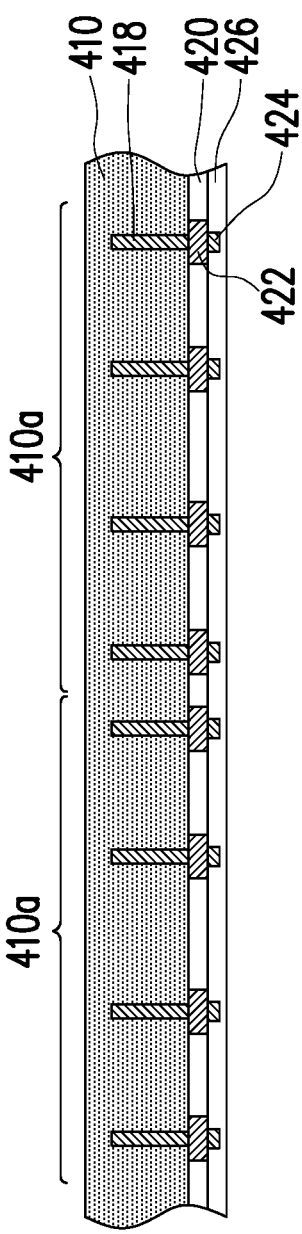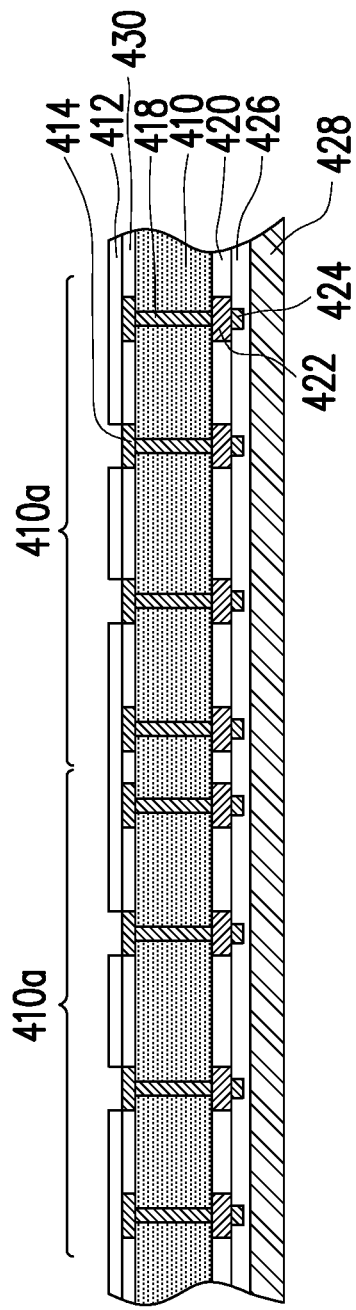

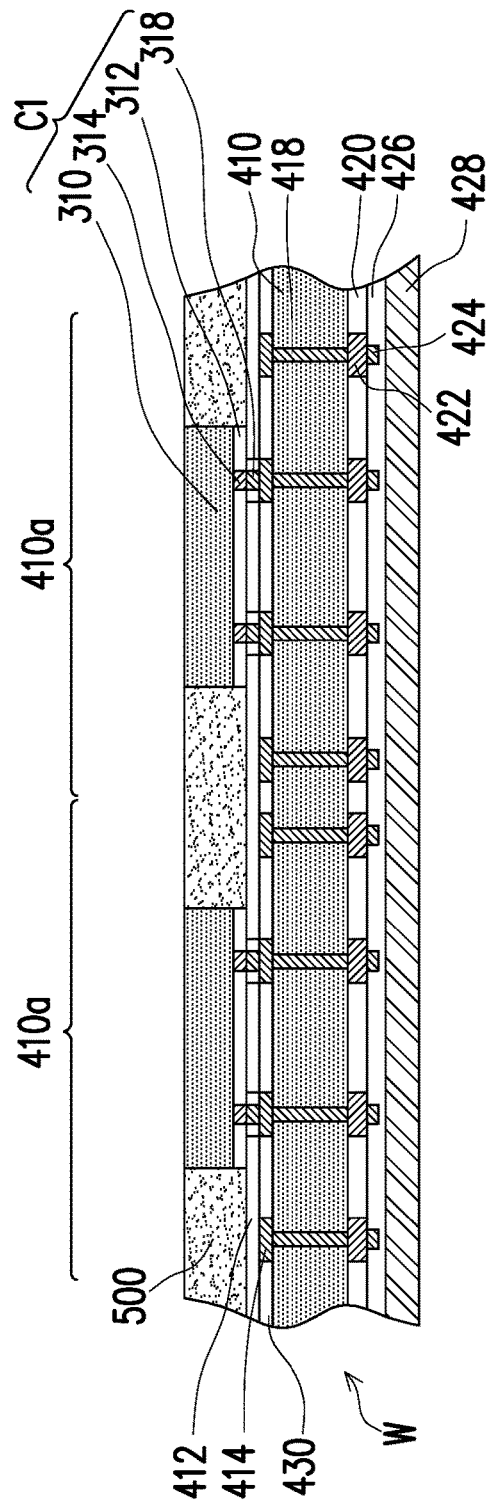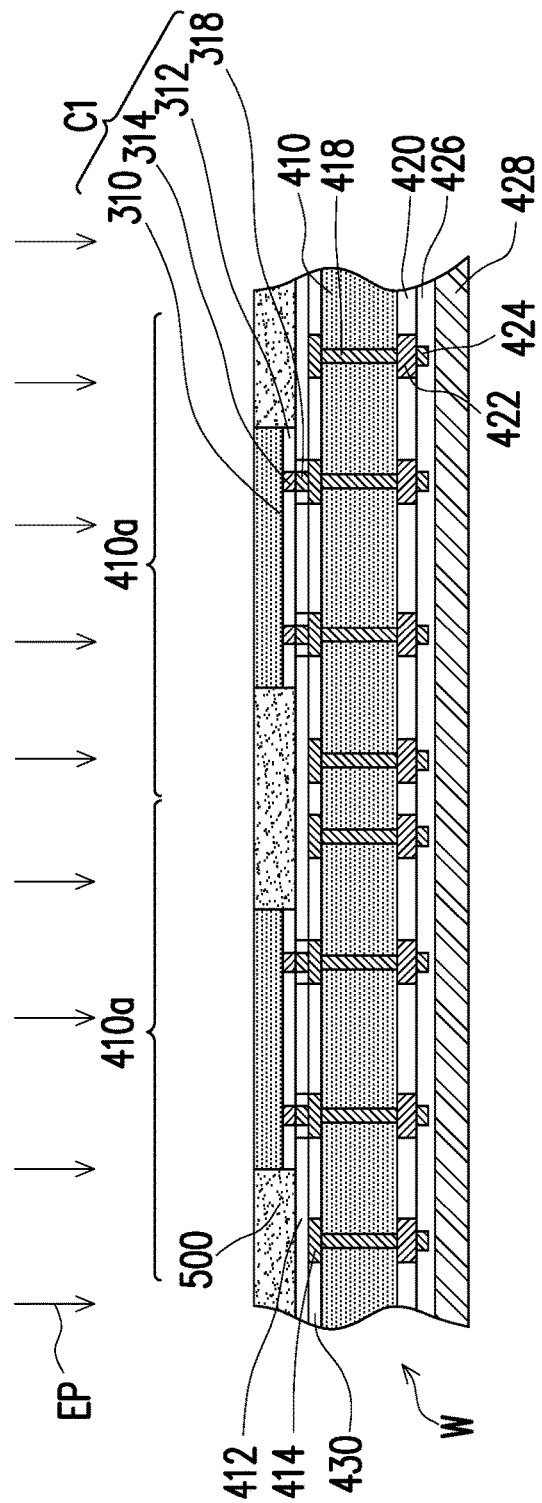

SEMICONDUCTOR STRUCTURES

CROSS-REFERENCE TO RELATED APPLICATION

This application is a continuation application of U.S. application Ser. No. 15/992,210, filed on May 30, 2018. The entirety of the above-mentioned patent application is hereby incorporated by reference herein and made a part of this specification.

BACKGROUND

Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

FIG. 9A through FIG. 9G are schematic views showing a method of forming a semiconductor structure in accordance with some embodiments.

DETAILED DESCRIPTION

Figure 1:
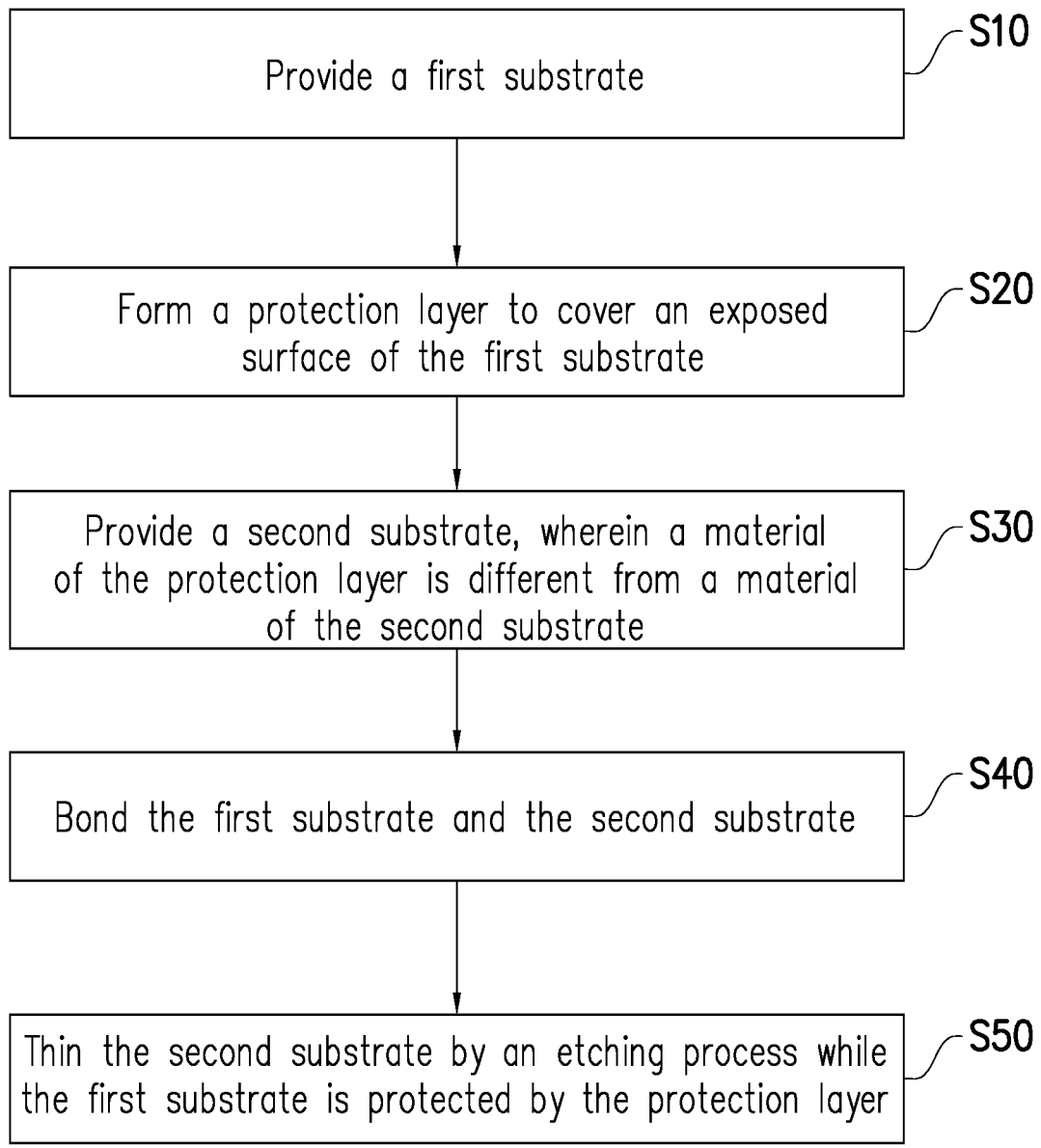
FIG. 1 is a flowchart showing a method of forming a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a flowchart showing a method of forming a semiconductor structure in accordance with some embodiments. FIG. 2A through FIG. 2E are schematic views showing a method of forming a semiconductor structure in accordance with some embodiments.

Figure 2A:
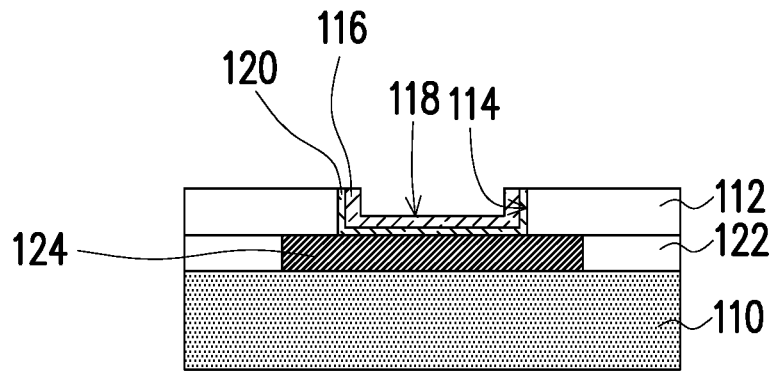
FIG. 2A through FIG. 2E are schematic views showing a method of forming a semiconductor structure in accordance with some embodiments.

Referring to FIGS. 1 and 2A, in Step S10, a first substrate 110 is provided. In some embodiments, the first substrate 110 may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or a gradient such as a substrate in which the ratio of Si and Ge vary across locations. In some embodiments, a material of the first substrate 110 has low etching selectivity with respect to the material of a second substrate 210 (shown in FIG. 2C) when using an etchant to etch the second substrate 210. In other words, the materials of the first substrate 110 and the second substrate 210 may be removed by the same etchant. In some embodiments, the first substrate 110 and the second substrate 210 may include the same material. In some embodiments, the first substrate 110 and the second substrate 210 are silicon substrates, for example. However, the disclosure is not limited thereto. In some alternative embodiments, the first substrate 110 and the second substrate 210 may have different materials, for example.

In some embodiments, the first substrate 110 includes a first dielectric layer 112 and a first pad 116 thereover. At least one of the first dielectric layer 112 and the first pad 116 is provided for bonding. In some embodiments, the first dielectric layer 112 includes, for example, silicon oxide ($SiO_x$), silicon oxynitride ($SiO_xN_y$), fluorine-doped silicon oxynitride ($SiO_xN_yF_z$), any other suitable material, and/or combinations thereof. In some embodiments, the first dielectric layer 112 includes a single dielectric layer or multiple dielectric layers. In some embodiments, a thickness of the first dielectric layer 112 ranges from 0.7 um to 1 um, for example.

In some embodiments, the first pad 116 is formed in an opening 114 of the first dielectric layer 112. In some embodiments, the first pad 116 has a depression 118 therein, in other words, the opening 114 is not filled with the first pad 116. In some embodiments, the first pad 116 is U-shaped, for example. However, in some alternative embodiments, the first pad 116 may fill up or protrude from the opening 114. In some embodiments, the first pad 116 having the depression 118 may be formed by conformally forming a conductive material on a sidewall and a bottom surface of the opening 114. In some alternative embodiments, the first pad 116 having the depression 118 may be formed by filling a conductive material in the opening 114 and removing a portion of the conductive pattern. In some embodiments, the first pad 116 is made of a conductive material, such as copper (Cu), copper alloy, aluminum (Al), aluminum alloy, nickel (Ni), nickel alloy any other suitable material, and/or combinations thereof. The first pad 116 includes a single metal layer or multiple metal layers. In some embodiments, the first pad 116 may be formed by a deposition process, an electroplating process, any other suitable process, and/or combinations thereof. In some embodiments, a diffusion barrier layer 120 may be formed aside the first pad 116. In some embodiments, a top surface of the first pad 116 is substantially coplanar with a top surface of the first dielectric layer 112. In some embodiments, a thickness of the first pad 116 ranges from 0.1 um to 0.3 um, and a depth of the depression 118 ranges from 0.4 um to 0.9 um, for example.

In some embodiments, a dielectric layer 122 and a conductive layer 124 are further formed between the first substrate 110 and the first dielectric layer 112. In some embodiments, the dielectric layer 122 includes, for example, a low dielectric constant (low-k) material such as silicon oxide ($SiO_2$), silicon nitride ($SiN_x$), any other suitable material, and/or combinations thereof. The dielectric layer 122 includes a single dielectric layer or multiple dielectric layers. A thickness of the dielectric layer 122 and the conductive layer 124 ranges from 0.7 um to 1 um, for example. The conductive layer 124 is formed in the dielectric layer 122, and the first pad 116 is electrically connected to the conductive layer 124. In some embodiments, a top surface of the conductive layer 124 is substantially coplanar with a top surface of the dielectric layer 122. In some embodiments, a width of the first pad 116 is smaller than the conductive layer 124, for example. However, in some alternative embodiments, a width of the first pad 116 may be equal to or larger than the conductive layer 124, for example. The conductive layer 124 is made of a conductive material, such as copper (Cu), copper alloy, aluminum (Al), aluminum alloy, any other suitable material, and/or combinations thereof. In some alternative embodiments, a diffusion barrier layer (not shown) may be formed aside the conductive layer 124.

In some embodiments, the first substrate 110 may include more dielectric layers and conductive layers therein/thereon. In addition, the first substrate 110 may include a plurality of integrated active devices, such as logic devices. The logic device includes an application processor (AP), a system on chip (SoC) or the like. In some embodiments, the system on chip (SoC) includes a modem module. Other types of active devices such as memory devices, MOSFET devices, CMOS devices and/or BJT devices may be used upon the process requirements.

Figure 2B:
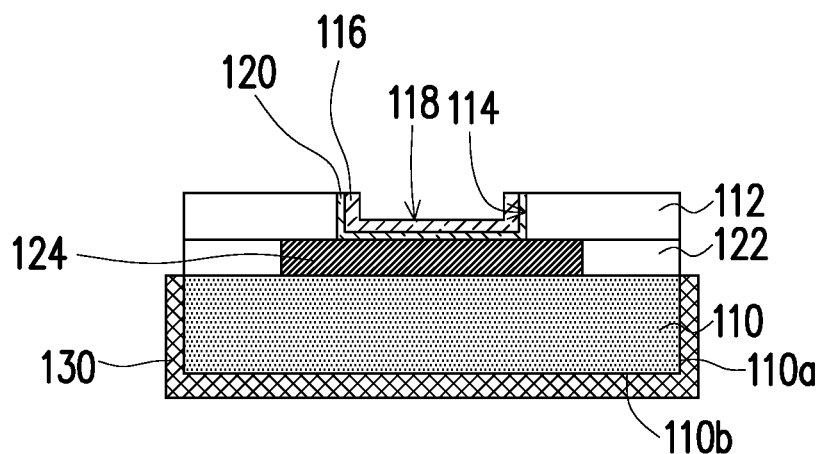

Referring to FIGS. 1 and 2B, in Step S20, a protection layer 130 is formed to cover an exposed surface of the first substrate 110. In some embodiments, the protection layer 130 is formed on a sidewall 110a and a surface 110b of the first substrate 110, for example. In some embodiments, the first dielectric layer 112 and the protection layer 130 are formed on opposite surfaces of the first substrate 110. For example, the first dielectric layer 112 is formed on a top surface of the first substrate 110, and the protection layer 130 is formed on the bottom surface of the first substrate 110. In some embodiments, the exposed surface of the first substrate 110 is entirely covered by the protection layer 130, that is, the first substrate 110 is not exposed. In some embodiments, the protection layer 130 is in direct contact with the first substrate 110. The protection layer 130 is U-shaped, for example. In some embodiments, a top surface of the protection layer 130 on the sidewall 110a is substantially flush with the top surface of the first substrate 110 and a bottom surface of the dielectric layer 122. However, the disclosure is not limited thereto. In some alternative embodiments, the top surface of the protection layer 130 may be lower or higher than the top surface of the first substrate 110. In other words, a portion of the sidewall 110a of the first substrate 110 may be exposed, or a portion of at least one of the dielectric layers 112, 122 may be covered by the protection layer 130. In some alternative embodiments, the protection layer 130 may be merely formed on the sidewall 110a or the bottom surface 110b of the first substrate 110.

In some embodiments, a material of the protection layer 130 is different from a material of the second substrate 210. In some embodiments, when using an etchant to etch the second substrate 210, an etching selectivity of the material of the second substrate 210 to the material of the protection layer 130 is larger than 20, for example. In some embodiments, when using an etchant to etch silicon, the material of the protection layer 130 has an etching selectivity with respect to silicon, for example. In some embodiments, the protection layer 130 may include silicon oxide ($SiO_2$), silicon nitride ($SiN_x$), silicon oxynitride ($SiO_xN_y$), silicon carbide (SiC), any other suitable material or combinations thereof. In some embodiments, the protection layer 130 may include silicon oxide ($SiO_2$) or silicon nitride ($SiN_x$), and the protection layer 130 may be formed by a deposition process such as a physical vapor deposition (PVD) process, a chemical vapor deposition (CVD) process, a plasma-enhanced chemical vapor deposition (PECVD) process, an electrochemical deposition (ECD) process, a molecular beam epitaxy (MBE) process or an atomic layer deposition (ALD) process. In some alternative embodiments, the protection layer 130 may include a molding compound, and may be formed by a molding process. In some alternative embodiments, the protection layer 130 may be a glass substrate, and the first substrate 110 may be adhered to the protection layer 130 through an adhesive. In some embodiments, a thickness of the protection layer 130 ranges from 502 nm to 2 um, for example.

Figure 2C:
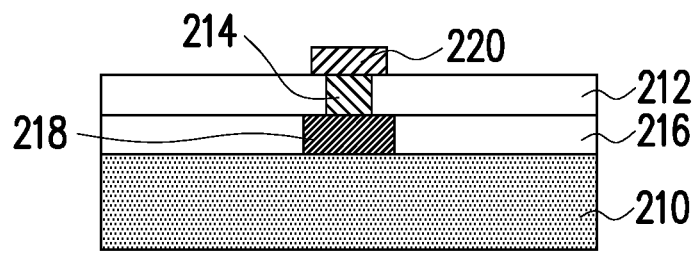

Referring to FIGS. 1 and 2C, in Step S30, a second substrate 210 is provided, and a material of the protection layer 130 is different from a material of the second substrate 210. In some embodiments, as mentioned above, when using an etchant to etch the second substrate 210, a material of the first substrate 110 has low etching selectivity with respect to the material of the second substrate 210. In some embodiments, the second substrate 210 includes the second dielectric layer 212 and the second pad 214 thereover. At least one of the second dielectric layer 212 and the second pad 214 is provided for bonding. In some embodiments, the second pad 214 fills up an opening of the second dielectric layer 212, and thus top surfaces of the second dielectric layer 212 and the second pad 214 are coplanar, for example. In some embodiments, a thickness of the second dielectric layer 212 and the second pad 214 range from 0.7 um to 1 um, for example. In some embodiments, a dielectric layer 216 and a conductive layer 218 are further disposed between the second substrate 210 and the second dielectric layer 212. The conductive layer 218 is disposed in the dielectric layer 216 and electrically connected to the second pad 214. The materials of the second substrate 210, the second dielectric layer 212, the second pad 214, the dielectric layer 216 and the conductive layer 218 may be respectively similar to those of the first substrate 110, the first dielectric layer 112, the first pad 116, the dielectric layer 122 and the conductive layer 124, and thus the description is omitted herein. In some embodiments, the materials of the second substrate 210, the second dielectric layer 212, the second pad 214, the dielectric layer 216 and the conductive layer 218 may be independently the same as or different from those of the first substrate 110, the first dielectric layer 112, the first pad 116, the dielectric layer 122 and the conductive layer 124. In some embodiments, a material of the first dielectric layer 112 may be different from a material of the second dielectric layer 212, for example. However, in some alternative embodiments, a material of the first dielectric layer 112 may be the same as a material of the second dielectric layer 212.

In some embodiments, a bump 220 is further formed on the second pad 214 for bonding. In some embodiments, the bump 220 is disposed on the second dielectric layer 212 over the second substrate 210 and protrudes from the second dielectric layer 212. In some embodiments, a width of the bump 220 is smaller than a width of the depression 118 of the first pad 116, for example. In some embodiments, the bump 220 is a lead free (LF) bump such as a tin-silver (SnAg) solder bump. In some alternative embodiments, at least one conductive layer such as a nickel (Ni) layer may be formed between the bump 220 and the second pad 214, for example.

Figure 2D:
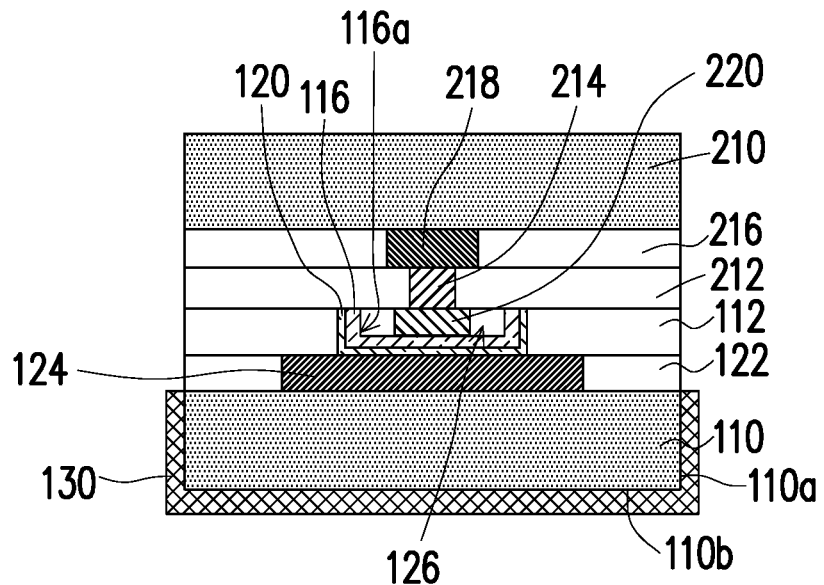

Referring to FIGS. 1 and 2D, in Step S40, the first substrate 110 and the second substrate 210 are bonded. In some embodiments, the second substrate 210 is turned over, and the first substrate 110 and the second substrate 210 are bonded through the first dielectric layer 112 and the second dielectric layer 212. In some embodiments, the first substrate 110 and the second substrate 210 are in a face-to-face alignment, where a frontside (e.g., the first dielectric layer 112 side) of the first substrate 110 faces a frontside (e.g., the second dielectric layer 212 side) of the second substrate 210. In some embodiments, the protection layer 130 and the second substrate 210 are disposed on opposite sides of the first substrate 110. In some embodiments, the first substrate 110 and the second substrate 210 are chip to chip bonding, for example. In some alternative embodiments, the first substrate 110 and the second substrate 210 are chip to wafer bonding or wafer to wafer bonding, for example.

In some embodiments, the first pad 116 of the first substrate 110 is also bonded to the bump 220 of the second substrate 210. In other words, the first substrate 110 and the second substrate 210 may be bonded by a hybrid bonding, for example. In some embodiments, the protruded bump 220 is inserted into the depression 118 of the first pad 116 to contact the first pad 116, and an intermetallic compound (IMC) layer (not shown) may be formed between the bump 220 and the first pad 116. In some embodiments, since the size of the bump 220 is designed as smaller than the size of the depression 118 of the first pad 116, a gap 126 is formed between the bump 220 and a sidewall 116a of the first pad 116 after bonding the first substrate 110 and the second substrate 210. In some embodiments, the gap 126 may be partially filled by or filled up with the IMC layer. In some embodiments, due to the size difference, the bump 220 may be bonded to the first pad 116 easily, and a window of the alignment process of the bump 220 and the first pad 116 is increased. In addition, the first pad 116 of the first substrate 110 is depressed and the bump 220 of the second substrate 210 is protruded, and thus they may be bonded more tightly. It is noted that the first substrate 110 and the second substrate 210 are exemplified as having the same diameter, but the disclosure is not limited thereto. In some alternative embodiments (not shown), the first substrate 110 and the second substrate 210 may have different diameters. In some embodiments, a sidewall of the protection layer 130 may be horizontally separated from a sidewall of the second substrate 210 by a distance, for example. In some alternative embodiments, the sidewall of the protection layer 130 may be aligned with the sidewall of the second substrate 210, for example.

Figure 2E:
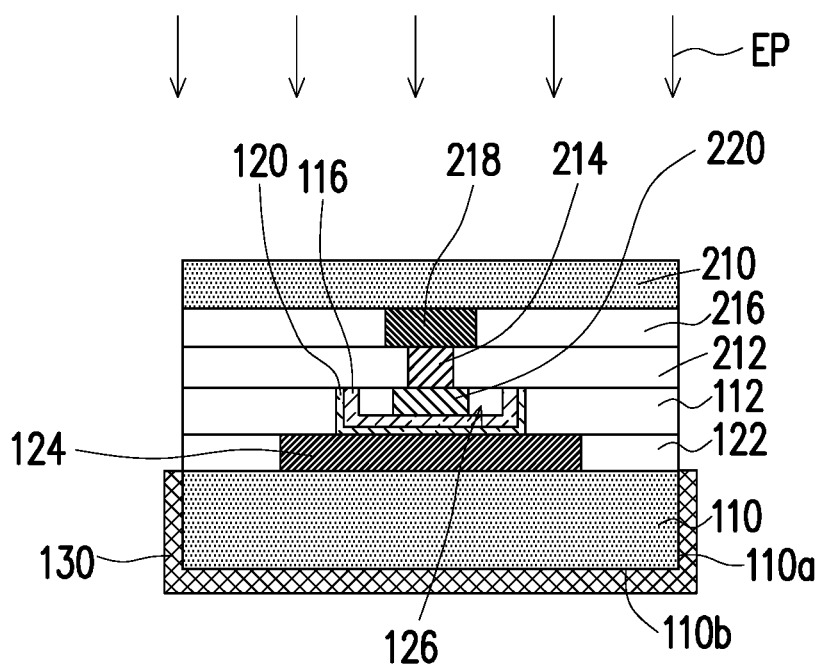

Referring to FIGS. 1 and 2E, in Step S50, the second substrate 210 is thinned by an etching process EP while the first substrate 110 is protected by the protection layer 130. In some embodiments, the materials of the first substrate 110 and the second substrate 210 have similar material characterization to an etchant of the etching process EP. In some embodiments, when using an etchant to etch the second substrate 210, the material of the first substrate 110 has substantially no etching selectivity with respect to the material of the second substrate 210. However, since the first substrate 110 is protected by the protection layer 130, the first substrate 110 is prevented from being damaged. In some embodiments, the etching process EP is a wet etching process, for example. In some embodiments, the etching process EP is a silicon wet etching process, for example. In the silicon wet etching process, the etchant is a mixture of potassium hydroxide (KOH) or tetramethylammonium hydroxide (TMAH), and the etching process may be performed at a temperature ranging from 80° C. to 100° C., for example. In some embodiments, after the thinning process, a thickness of the second substrate 210 may range from 10 um to 40 um. In some embodiments, it is not required to remove the protection layer 130 after thinning the second substrate 210. In other words, the protection layer 130 is retained.

After the thinning process, the packaging procedures such as an encapsulating process and a forming process of electrical connections may be performed on the structure of FIG. 2E to form a package. In some alternative embodiments, if at least one of the first substrate 110 and the second substrate 210 is a wafer, a dicing process or singulation process may be performed before the packaging procedures.

Generally, a grinding process such as a chemical mechanical polishing (CMP) is used to thin the top substrate of the bonded structure. However, the grinding process may cause damage to inner structure such as the pads of the bonded structure. In some embodiments, by forming the protection layer 130 to cover the bottom substrate of the bonded structure (i.e., the first substrate 110), the etching process such as a wet etching process only removes a portion of the top substrate of the bonded structure (i.e., the second substrate 210) without damaging the substrate of the bottom substrate. In other words, although the wet etching process is an isotropic etching process, by using the protection layer, an undesired etching is prevented, and the etching direction is controlled as one direction toward the top substrate. In other words, by forming the protection layer and taking an advantage of the etching selectivity of the protection layer and the substrate with respect to the etchant used to remove the substrate, the chemical method can be applied to thin one of the substrates of the bonded structure, and the mechanical force and thus the damage to the bonded structure due to the grinding process can be prevented. In addition, since the protection layer may be retained in the bonded structure, the removal for the protection layer is not required. Accordingly, the formation of the protection layer would not significantly increase cost or time for the manufacture of semiconductor structure.

Figure 3:
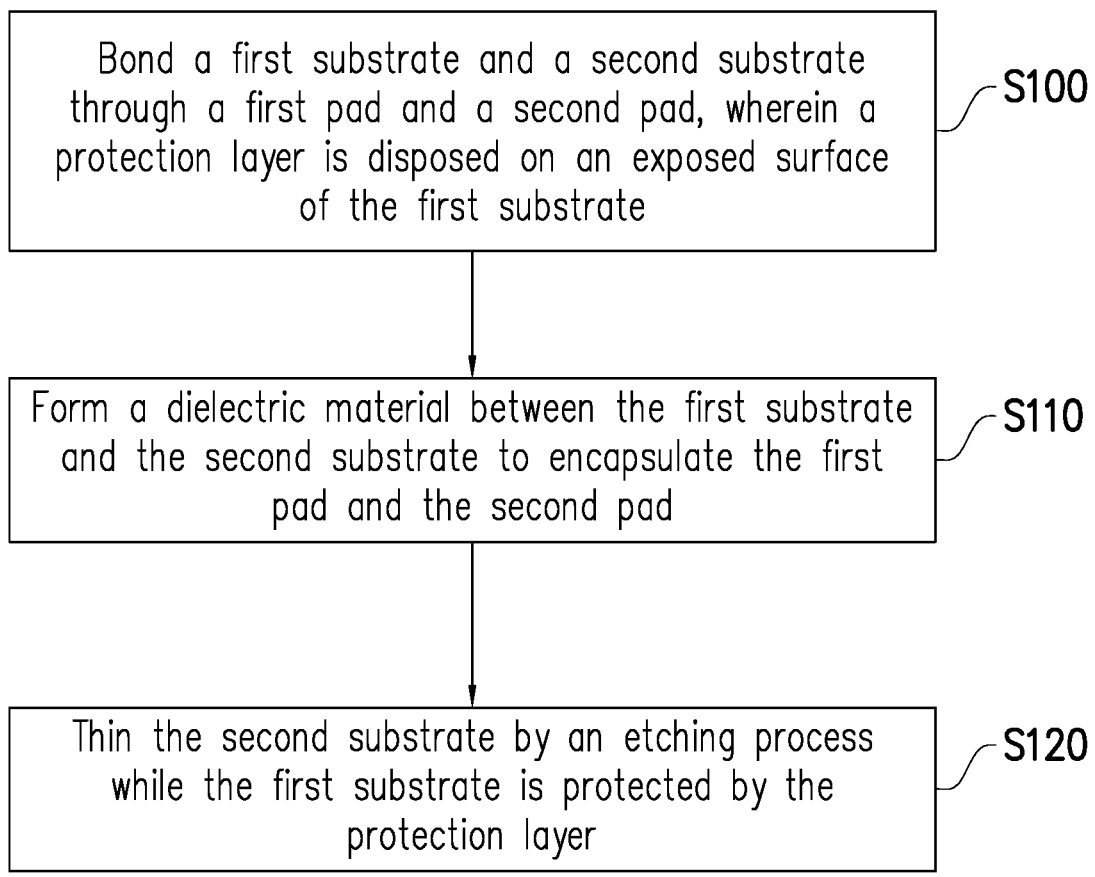
FIG. 3 is a flowchart showing a method of forming a semiconductor structure in accordance with some embodiments.
Figure 4A:
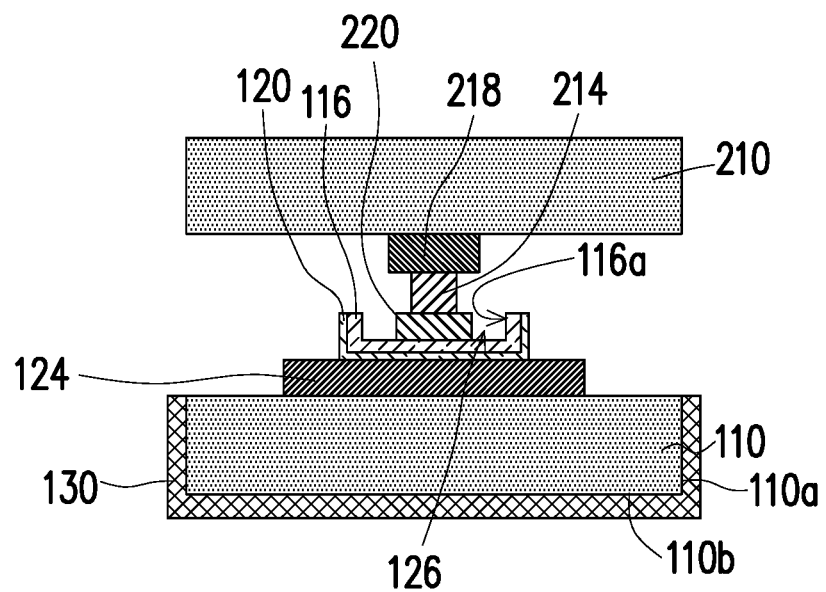
FIG. 4A through FIG. 4C are schematic views showing a method of forming a semiconductor structure in accordance with some embodiments.
Figure 4B:
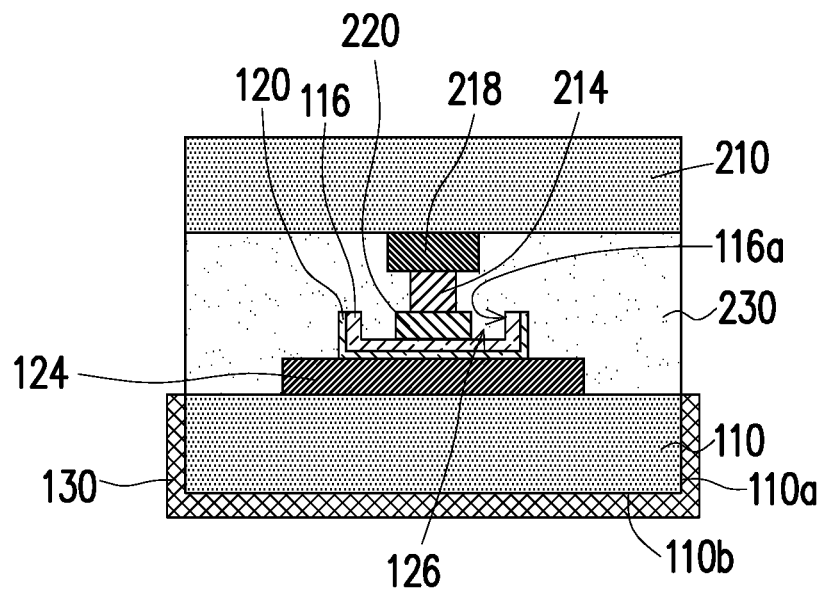
Figure 4C:
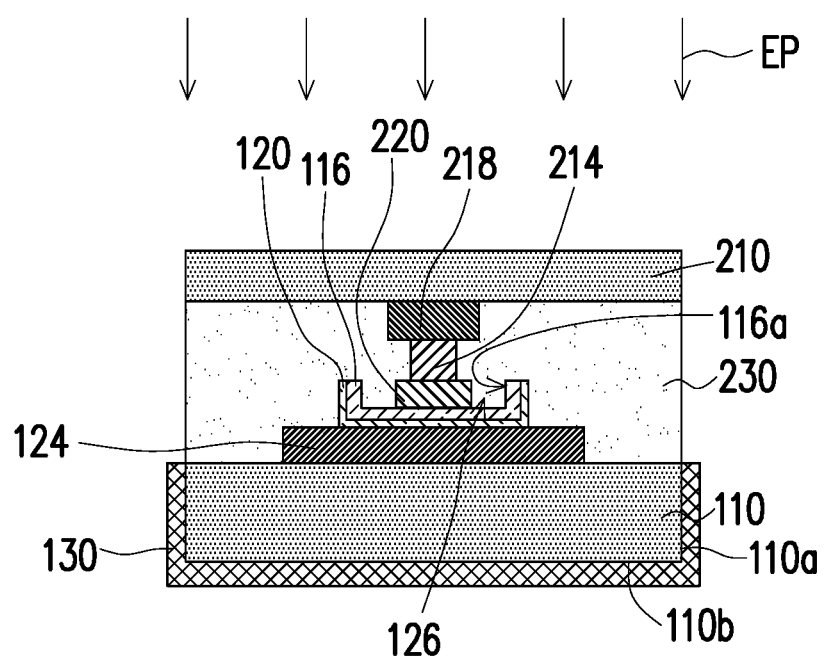

FIG. 3 is a flowchart showing a method of forming a semiconductor structure in accordance with some embodiments. FIG. 4A through FIG. 4C are schematic views showing a method of forming a semiconductor structure in accordance with some embodiments.

Referring to FIGS. 3 and 4A, in Step S100, a first substrate 110 and a second substrate 210 are bonded through a first pad 116 and a second pad 214, and a protection layer 130 is disposed on an exposed surface of the first substrate 110. In some embodiments, the bonded structure and the protection layer 130 are similar to those of FIG. 2D except that the first substrate 110 and the second substrate 210 are provided without the dielectric layers 112, 122, 212, 216. In other words, the sidewalls of the barrier 120 aside the first pad 116, the second pad 214, the conductive layers 124, 218 and the bump 220 are exposed. In some embodiments, the first substrate 110 and the second substrate 210 are bonded by a metal to metal bonding, for example. In some embodiments, after bonding the first pad 116 and the second pad 214, a gap 126 is formed between the bump 220 and an inner sidewall 116a of the first pad 116.

Referring to FIGS. 3 and 4B, in Step S110, a dielectric material 230 is formed between the first substrate 110 and the second substrate 210 to encapsulate the first pad 116 and the second pad 214. In some embodiments, the bonded structure includes the first substrate 110, the second substrate 210, the protection layer 130 and the dielectric material 230. In some embodiments, the dielectric material 230 is formed to encapsulate the first pad 116, the second pad 214 and the conductive layers 124, 218. In addition, the gap 126 is filled up with the dielectric material 230. In some embodiments, the dielectric material 230 may include silicon oxide ($SiO_x$), silicon oxynitride ($SiO_xN_y$), fluorine-doped silicon oxynitride ($SiO_xN_yF_z$), any other suitable material, and/or combinations thereof. In some embodiments, the dielectric material 230 may include a molding compound such as epoxy molding compound, an underfill, a polymer material such as benzocyclobutene (BCB) polymer, polyimide (PI) and polybenzoxazole (PBO), any other suitable material or combinations thereof. In some embodiments, the dielectric material 230 may be formed by a deposition process, a molding process, an underfill process, any other suitable process or combinations thereof.

Referring to FIGS. 3 and 4C, in Step S120, the second substrate 210 is thinned by an etching process EP while the first substrate 110 is protected by the protection layer 130. In some embodiments, the etching process EP is similar to that described in FIG. 2E, and is not repeated herein.

Figure 5A:
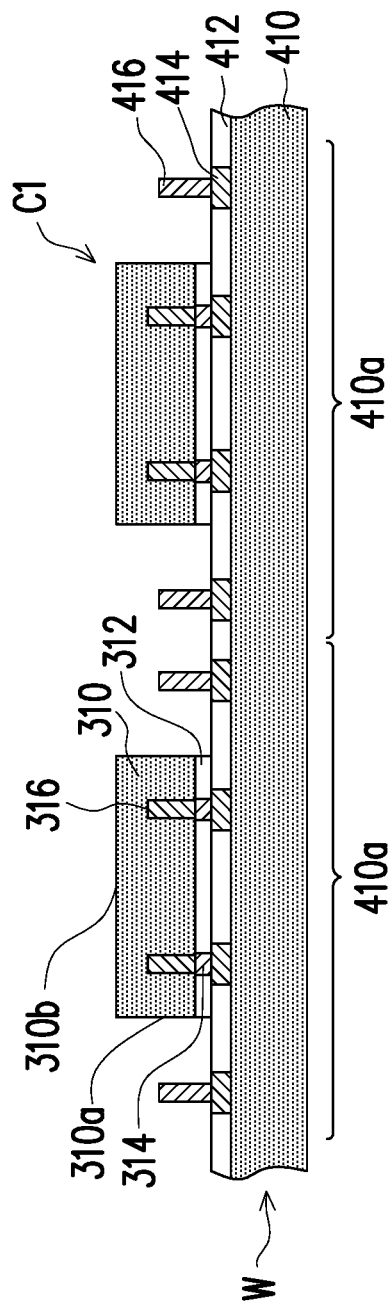
FIG. 5A through FIG. 5H are schematic views showing a method of forming a semiconductor structure in accordance with some embodiments.

FIG. 5A through FIG. 5H are schematic views showing a method of forming a semiconductor structure in accordance with some embodiments. Referring to FIG. 5A, a chip (or a die) C1 including a substrate 310 is bonded to a wafer W including a substrate 410. In some embodiments, the chip C1 further includes a dielectric layer 312, a plurality of pads 314 in the dielectric layer 312 and a plurality of conductive pillars 316 on the pads 314. In some embodiments, the dielectric layer 312 and the pads 314 are provided for bonding. In some embodiments, the chip C may be any suitable memory chip such as DRAM, for example. In some embodiments, the chip C1 may further include dielectric layers, conductive layers and/or integrated active devices between the substrate 310 and the dielectric layer 312 and the substrate 310 and the pads 314, for example. In some embodiments, the substrate 310, the dielectric layer 312 and the pads 314 are similar to those of the substrate 110, the dielectric layer 112 and the pads 116, and the details are not repeated herein.

In some embodiments, the wafer W further includes a dielectric layer 412 and a plurality of pads 414 in the dielectric layer 412. In some embodiments, the dielectric layer 412 and the pads 414 are provided for bonding. In some embodiments, a plurality of conductive pillars 416 is formed on the wafer W to electrically connect the pads 414. The conductive pillars 416 may be copper pillars, for example. In some embodiments, the wafer W may further include dielectric layers, conductive layers and/or integrated active devices between the substrate 410 and the dielectric layer 412 and the substrate 410 and the pads 414, for example. In some embodiments, the substrate 410, the dielectric layer 412 and the pads 414 are similar to those of the substrate 210, the dielectric layer 212 and the pads 214, and the details are not repeated herein.

In some embodiments, the chip C1 is bonded to one of the chip areas 410a of the wafer W to form a bonded structure. The chip C1 is bonded to the wafer W through the pads 314 and the pads 414. In some embodiments, the bonding is chip to wafer bonding, and a chip-on-wafer (CoW) structure is formed, for example. In some embodiments, the chip C1 is disposed between the conductive pillars 416 in the chip area 410a.

Figure 5B:
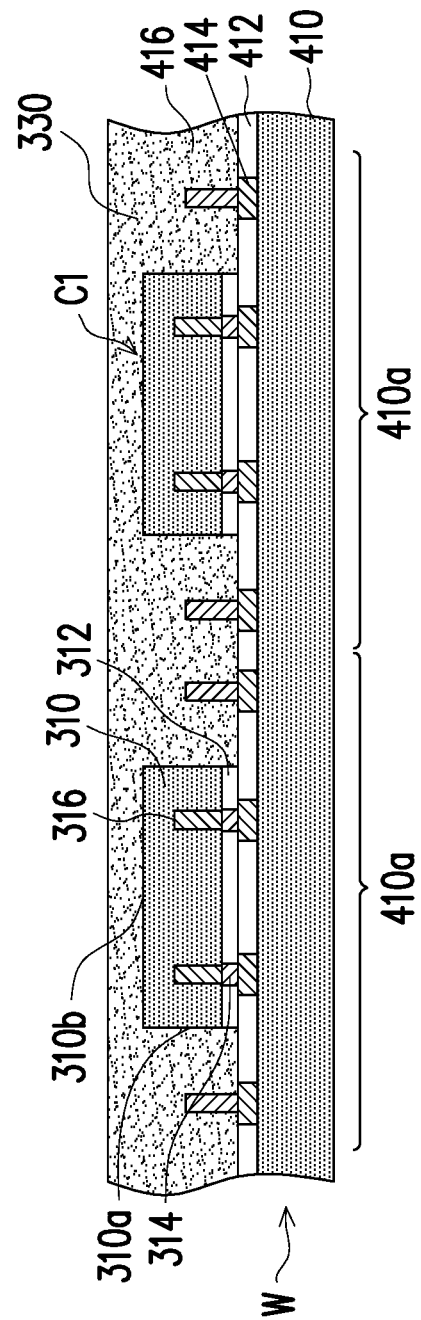

Referring to FIG. 5B, a protection layer 330 is formed to encapsulate the chip C1. In some embodiments, the protection layer 330 is disposed on an exposed surface of the chip C1, which are a sidewall 310a and a surface 310b of the substrate 310. In some embodiments, the protection layer 330 is formed between the chips C1 and covers the chips C1 and the conductive pillars 416 over the wafer W. In some embodiments, the protection layer 330 is similar to the protection layer 130, and the details are not repeated herein. In some embodiments, the protection layer 330 includes an encapsulating material such as a molding compound (for example, epoxy molding compound (EMC)), a molding underfill, a resin, an epoxy, and/or the like, and may be formed by a molding process.

Figure 5C:
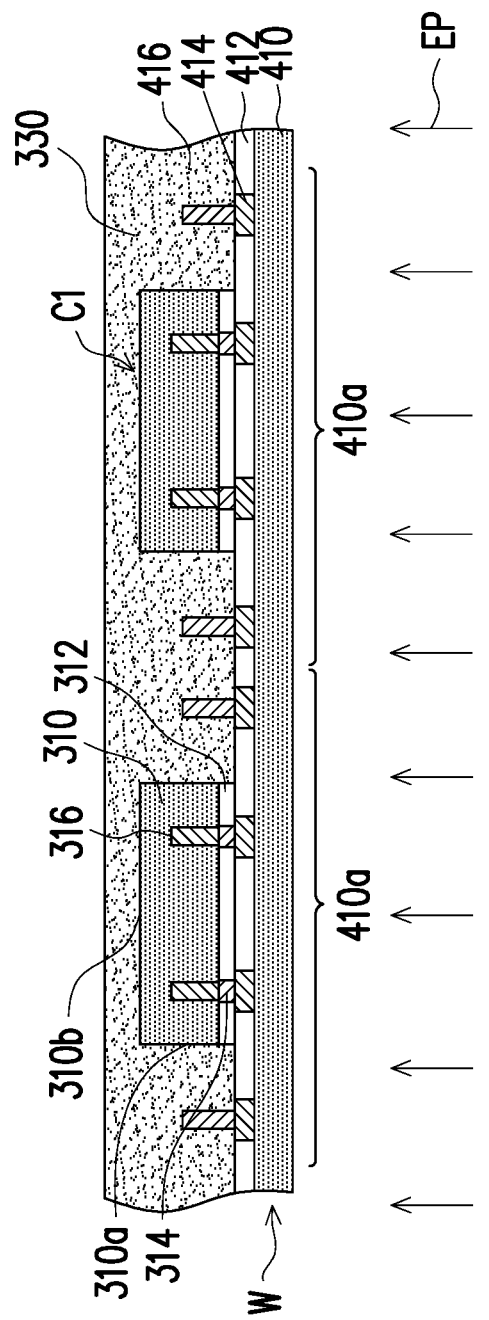

Referring to FIG. 5C, the substrate 410 of the wafer W is thinned by an etching process EP while the substrate 310 of the chip C1 is protected by the protection layer 330. In some embodiments, the chip C is entirely covered by the protection layer 330, for example. In some embodiments, although the substrate 310 of the chip C has similar etching selectivity with respect to the substrate 410 of the wafer W when using an etchant to etch the substrate 410, the substrate 310 of the chip C1 is not damaged by the etching process EP since the substrate 310 is protected by the protection layer 330.

Figure 5D:
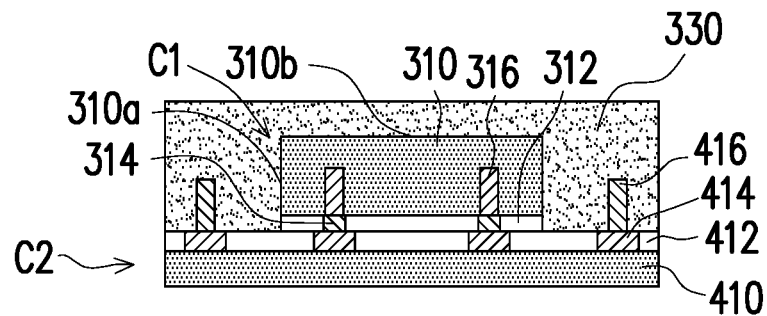

Referring to FIG. 5D, the bonded structure of FIG. 5C is diced to form a bonded unit 502. In some embodiments, the bonded unit 502 includes the chip C1, a chip (or a die) C2 diced from the chip area 410a of the wafer W, and the protection layer 330 on the chip C1. In some embodiments, the bonded unit 502 is a small outline integrated circuit (SoIC) package, for example.

Figure 5E:
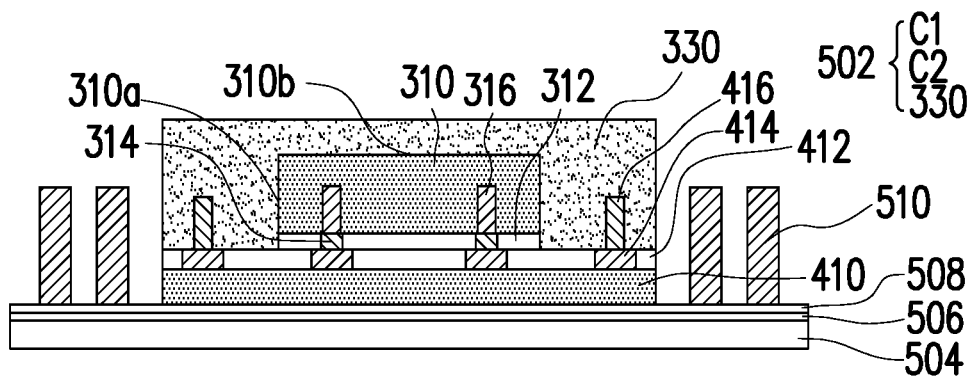

Referring to FIG. 5E, the bonded unit 502 is placed onto a carrier 504. In some embodiments, a de-bonding layer 506 and a dielectric layer 508 are stacked over the carrier 504 in sequential order, and a plurality of conductive posts 510 is formed over the dielectric layer 508. The bonded unit 502 is mounted onto the dielectric layer 508 having the conductive posts 510 formed thereon.

Figure 5F:
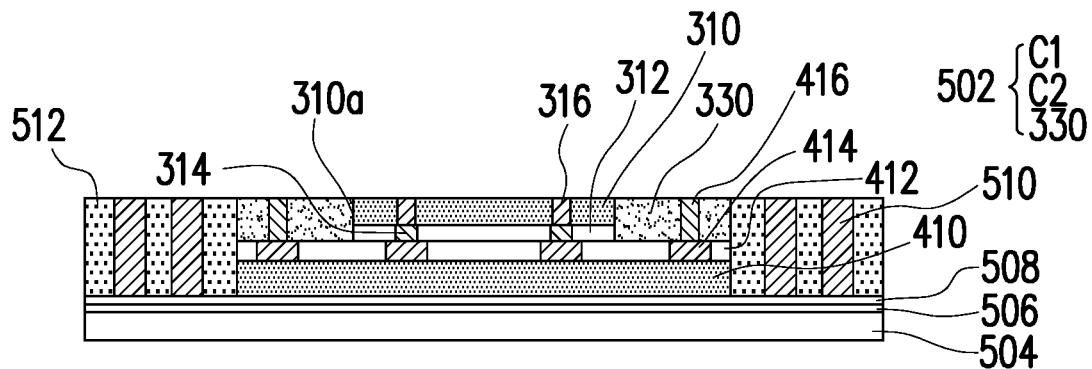

Referring to FIG. 5F, the bonded unit 502 is encapsulated in an encapsulating material 512, and the encapsulating material 512 and the protection layer 330 are grinded. In some embodiments, the encapsulating material 512 is formed on the dielectric layer 508 to encapsulate the conductive posts 510 and the bonded unit 502. In some embodiments, the material of the encapsulating material 512 may be the same as or different form a material of the protection layer 330. In some embodiments, the encapsulating material 512 may include a molding compound, a molding underfill, a resin, an epoxy, and/or the like.

In some embodiments, the encapsulating material 512 and the protection layer 330 are grinded until the top surfaces of the conductive pillars 316, 416 and the conductive posts 510 are exposed. In some embodiments, the grinding process may be a mechanical grinding, a chemical mechanical polishing (CMP), or another suitable mechanism, for example. In some embodiments, after grinding, portions of the protection layer 330 are removed, and the remained protection layer 330 is disposed on the sidewall of the substrate 310 of the chip C1 and between the substrate 310 and the encapsulating material 512, for example.

Figure 5G:
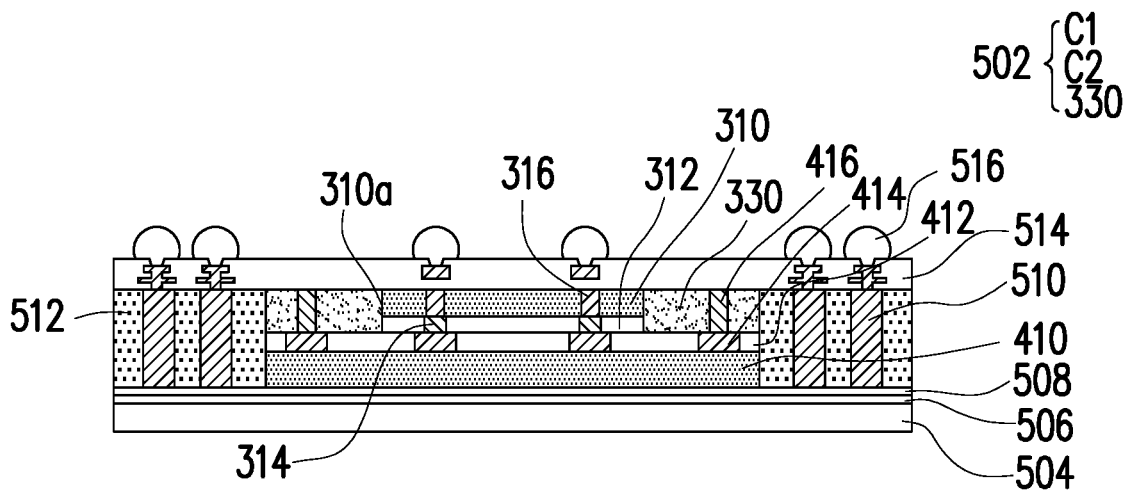

Referring to FIG. 5G, a redistribution circuit structure 514 electrically connected to the bonded unit 502 is formed over the encapsulating material 512 and the bonded unit 502. In some embodiments, the redistribution circuit structure 514 is formed on the top surfaces of the conductive posts 510, the encapsulating material 512, the protection layer 330 and the conductive pillars 416 to electrically connect the conductive pillars 416 of the bonded unit 502 and the conductive posts 510. In some embodiments, the redistribution circuit structure 514 includes a plurality of inter-dielectric layers and a plurality of redistribution conductive patterns stacked alternately. After the redistribution circuit structure 514 is formed, a plurality of conductive terminals 516 are formed on the redistribution circuit structure 514. In some embodiments, the conductive terminals 516 may be a ball grid array (BGA), for example.

Figure 5H:
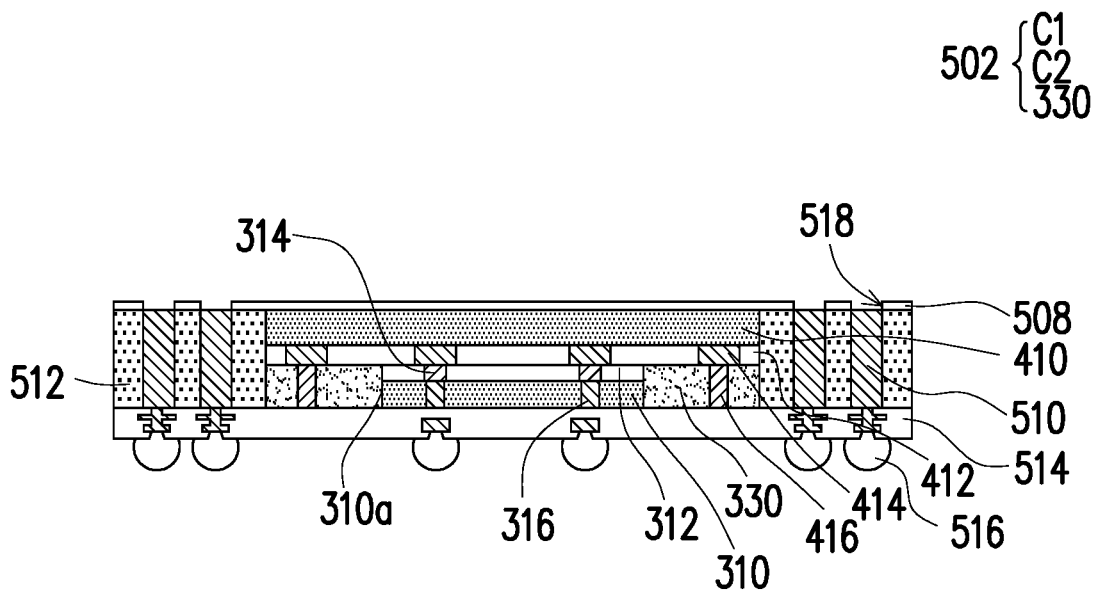

Referring to FIG. 5H, the formed structure of 6G is de-bonded from the carrier 504. In some embodiments, the dielectric layer 508 is de-bonded from the de-bonding layer 506 such that the dielectric layer 508 is separated from the carrier 504. In some embodiments, the dielectric layer 508 is patterned such that a plurality of contact openings 518 is formed to partially expose the conductive posts 510. Herein, formation of a package is substantially completed. In some alternative embodiments, a plurality of conductive terminals (not shown) may be placed in the contact openings 518 to electrically connect the redistribution circuit structure 514 and the conductive posts 510.

In some embodiments, before mounting on the carrier, the substrate of the wafer is thinned by the etching process rather than a grinding process. Therefore, the damage to inner structure of the bonded unit due to the grinding process is prevented. Accordingly, the property of the package formed from the bonded structure may be improved. In addition, in some embodiments, the protection layer may be served as the encapsulant aside the chip (i.e., chip C1) and thus the encapsulant is not additionally formed, and the cost or time for the manufacture of semiconductor structure is not increased.

Figure 6A:
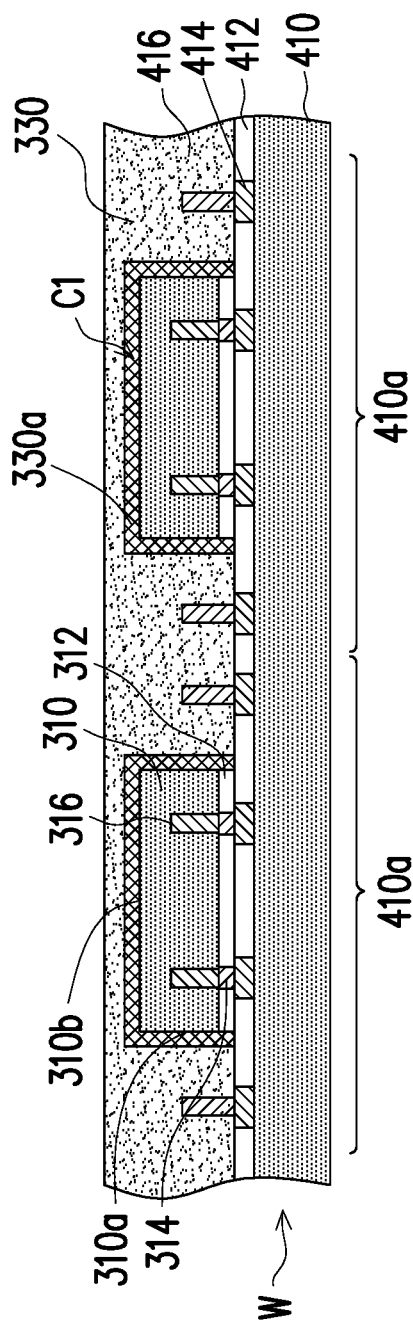
FIG. 6A through FIG. 6E are schematic views showing a method of forming a semiconductor structure in accordance with some embodiments.

FIG. 6A through FIG. 6E are schematic views showing a method of forming a semiconductor structure in accordance with some embodiments. The method of FIG. 6A through FIG. 6E is similar to the method of FIG. 5A through FIG. 5H, the main difference lies in a protection layer is additionally formed on the exposed surface of the chip and between the chip and the encapsulating material. Referring to FIG. 6A, a protection layer 330a is formed on an exposed surface of the chip C1. In some embodiments, the protection layer 330a is disposed on a sidewall 310a and a surface 310b of the substrate 310. Then, the chip C1 is bonded to the wafer W, and a protection layer 330 encapsulates the chip C1 having the protection layer 330a thereon. In some embodiments, the material of the protection layer 330a is similar to that of the protection layer 130 of FIG. 2B, and a material of the protection layer 330a is different from a material of the protection layer 330. In some embodiments, the protection layer 330 includes an encapsulating material such as a molding compound (for example, epoxy molding compound (EMC)), a molding underfill, a resin, an epoxy, and/or the like, and may be formed by a molding process.

Figure 6B:
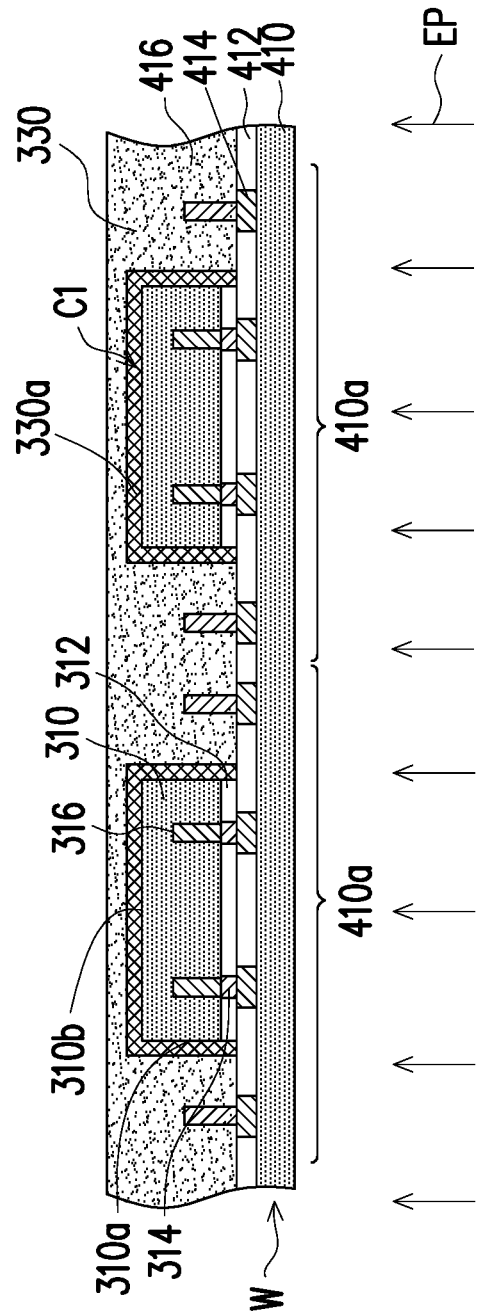
Figure 6C:
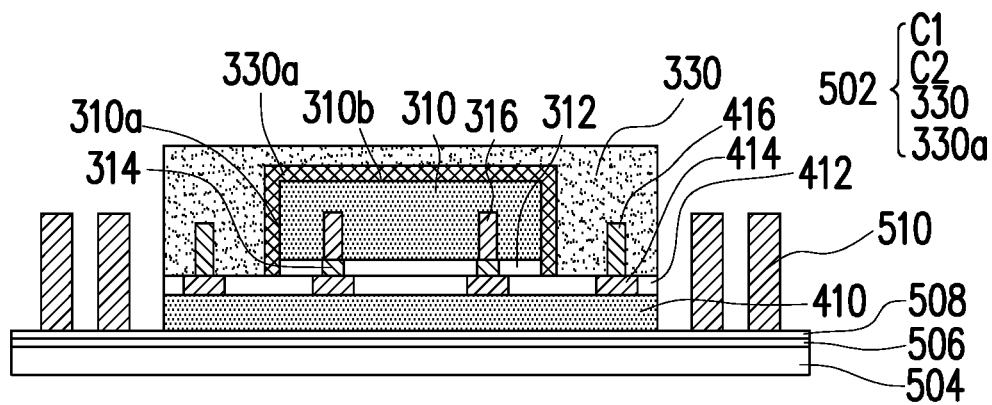
Figure 6D:
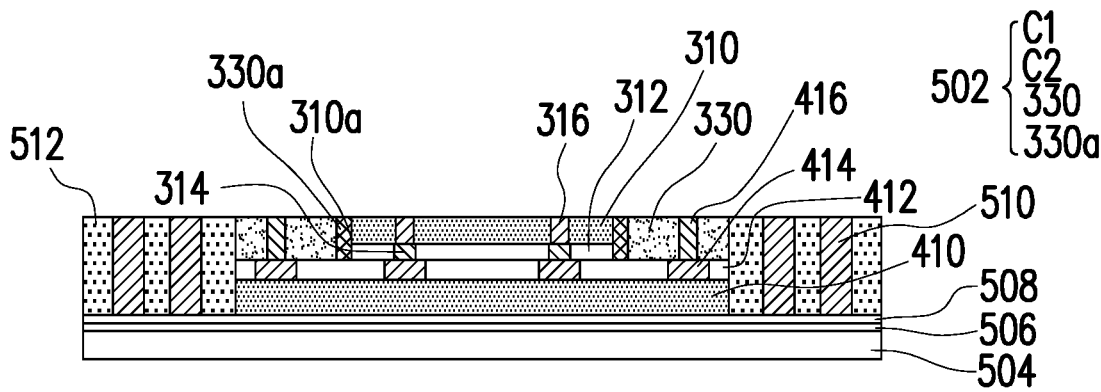
Figure 6E:
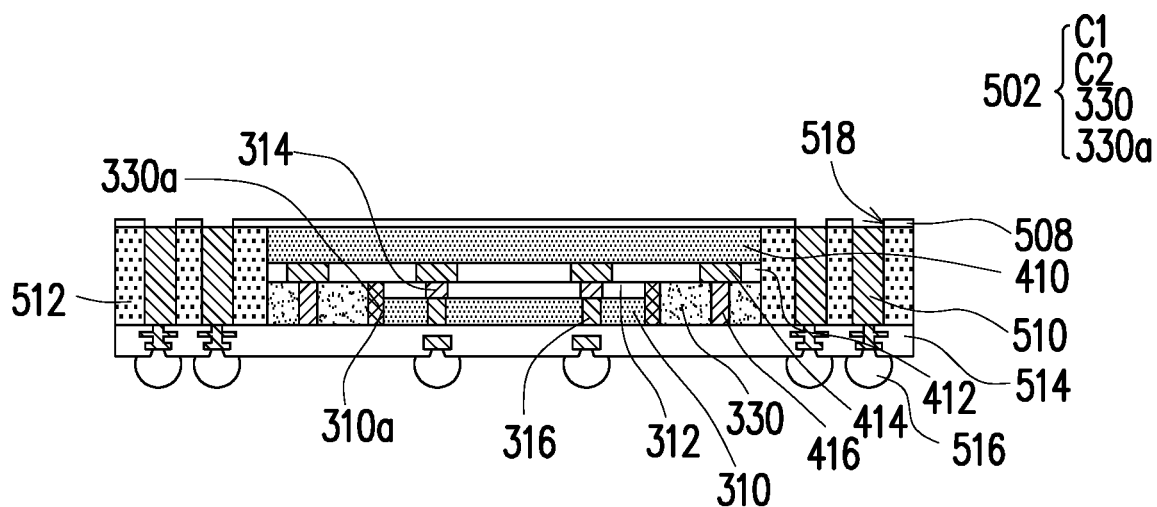

Referring to FIG. 6B, the substrate 410 of the wafer W is thinned by an etching process EP while the substrate 310 of the chip C1 is protected by the protection layer 330a and the protection layer 330. Referring to FIG. 6C, the bonded structure of FIG. 6B is diced to form the bonded unit 502, the bonded unit 502 is placed on the carrier 504, and the bonded unit 502 is encapsulated by the encapsulating material 512. Referring to FIG. 6D, the protection layer 330a, the protection layer 330 and the encapsulating material 512 are grinded until the top surfaces of the conductive pillars 316, 416 and the conductive posts 510 are exposed. In some embodiments, after grinded, the protection layer 330a is on the sidewall of the chip C1 and between the chip C and the protection layer 330. Referring to FIG. 6E, a redistribution circuit structure 514 is formed on the top surfaces of the protection layers 330, 330a, the encapsulating material 512 and the conductive posts 510. Then, the formed structure is de-bonded from the carrier 504, and a plurality of conductive terminals 516 and a plurality of contact openings 518 in the dielectric layer 508 are formed, so as to form a package.

Figure 7A:
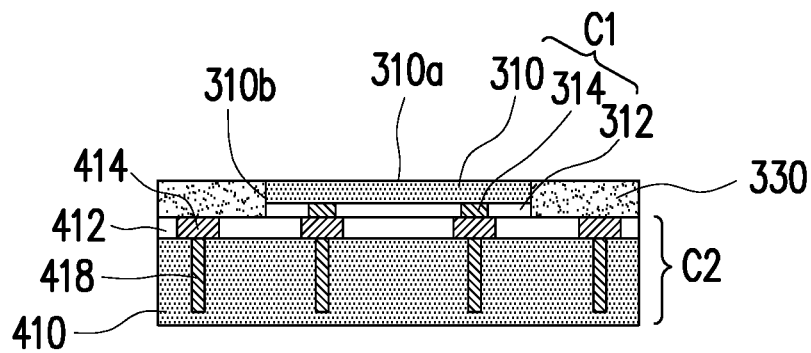
FIG. 7A through FIG. 7D are schematic views showing a method of forming a semiconductor structure in accordance with some embodiments.

FIG. 7A through FIG. 7D are schematic views showing a method of forming a semiconductor structure in accordance with some embodiments. Referring to FIG. 7A, a first chip C1 and a second chip C2 are bonded to form a bonded unit 502, and a protection layer 330 is formed on the chip C1. In some embodiments, the chip C includes a substrate 310, a dielectric layer 312 and a plurality of pads 314 in the dielectric layer 312. In some embodiments, the chip C2 includes a substrate 410, a dielectric layer 412, a plurality of pads 414 in the dielectric layer 412 and a plurality of through vias 418 electrically connected to the pads 414. In some embodiments, the protection layer 330 is formed on a sidewall 310a of the substrate 310, and a surface 310b of the substrate 310 is exposed. In some embodiments, the material of the protection layer 330 is similar to that of the protection layer 130 of FIG. 2B. In some embodiments, the material of the protection layer 330 includes an encapsulating material such as a molding compound (for example, epoxy molding compound (EMC)), a molding underfill, a resin, an epoxy, and/or the like, and may be formed by a molding process. In some embodiments, the bonded unit 502 having the protection layer 330 may be formed by bonding a plurality of chips C1 to a wafer including a plurality of chips C2 to form a bonded structure, forming a protection material to encapsulate the chips C1, optionally grinding the protection material to form the protection layer, and dicing the bonded structure.

Figure 7B:
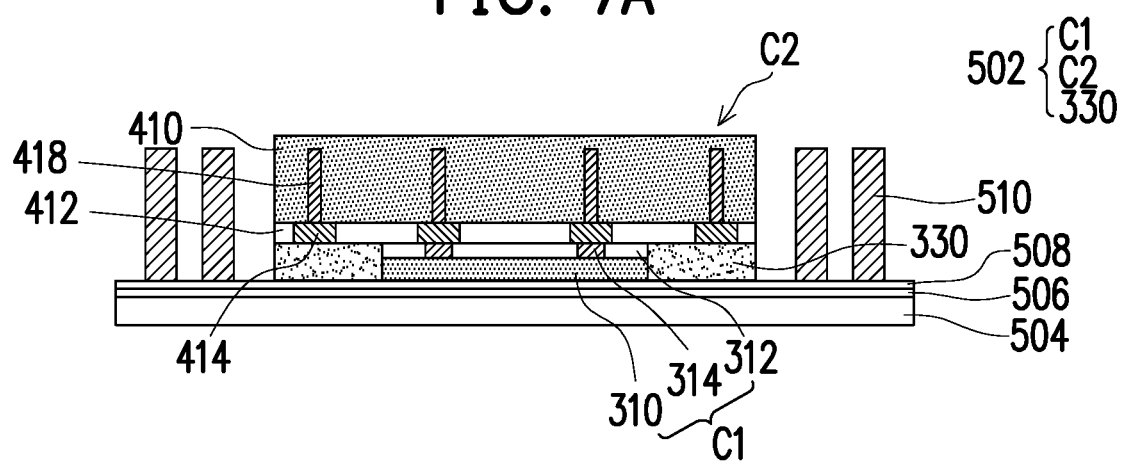

Referring to FIG. 7B, the bonded unit 502 is placed on a carrier 504 with a plurality of conductive posts 510 formed thereon. In some embodiments, the chip C1 is disposed between the chip C2 and the carrier 504.

Figure 7C:
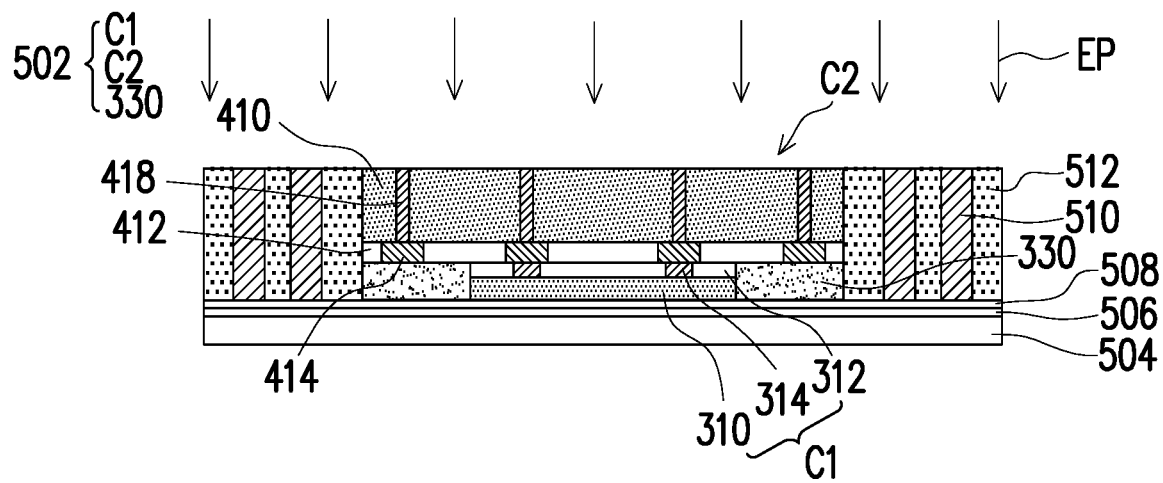

Referring to FIG. 7C, the bonded unit 502 is encapsulated (molded) in an encapsulating material 512. In some embodiments, the protection layer 330 is disposed between the chip C1 and the encapsulating material 512 below the chip C2. Then, the substrate 410 of the chip C2 is thinned by an etching process EP until the top surfaces of the through vias 418 are exposed. In some embodiments, the etching process EP is a wet etching process. During the thinning process, the substrate 310 of the chip C1 is protected by the protection layer 330 and the encapsulating material 512, and thus the substrate 310 is not damaged by the etchant used in the etching process EP. After that, the encapsulating material 512 is grinded until the top surfaces of the conductive posts 510 are exposed and coplanar with a top surface of the chip C2.

Figure 7D:
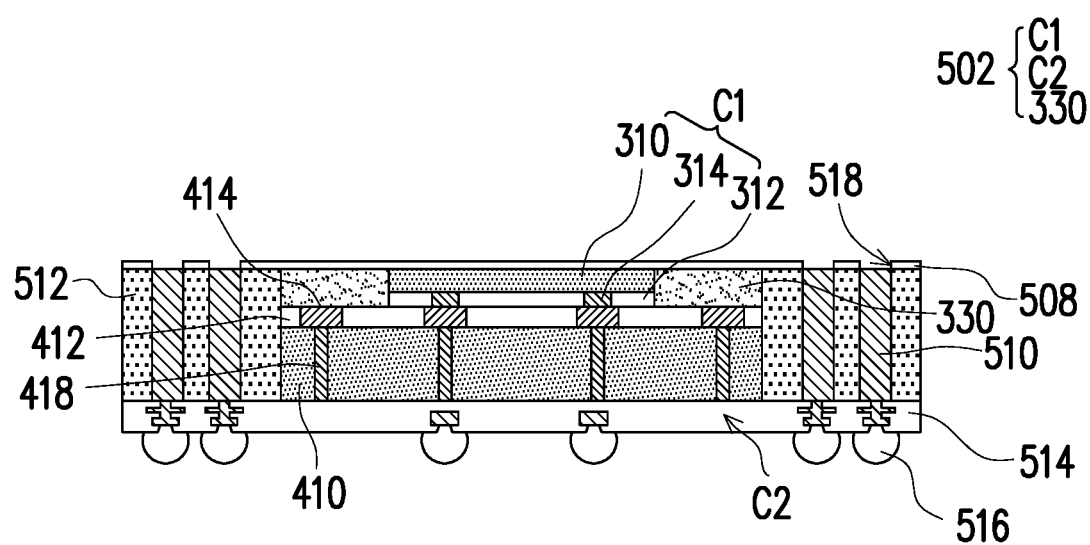

Referring to FIG. 7D, a redistribution circuit structure 514 is formed on the top surfaces of the encapsulating material 512 and the conductive posts 510. Then, the formed structure is de-bonded from the carrier 504, and a plurality of conductive terminals 516 and a plurality of contact openings 518 in the dielectric layer 508 are formed, so as to form a package.

Figure 8:
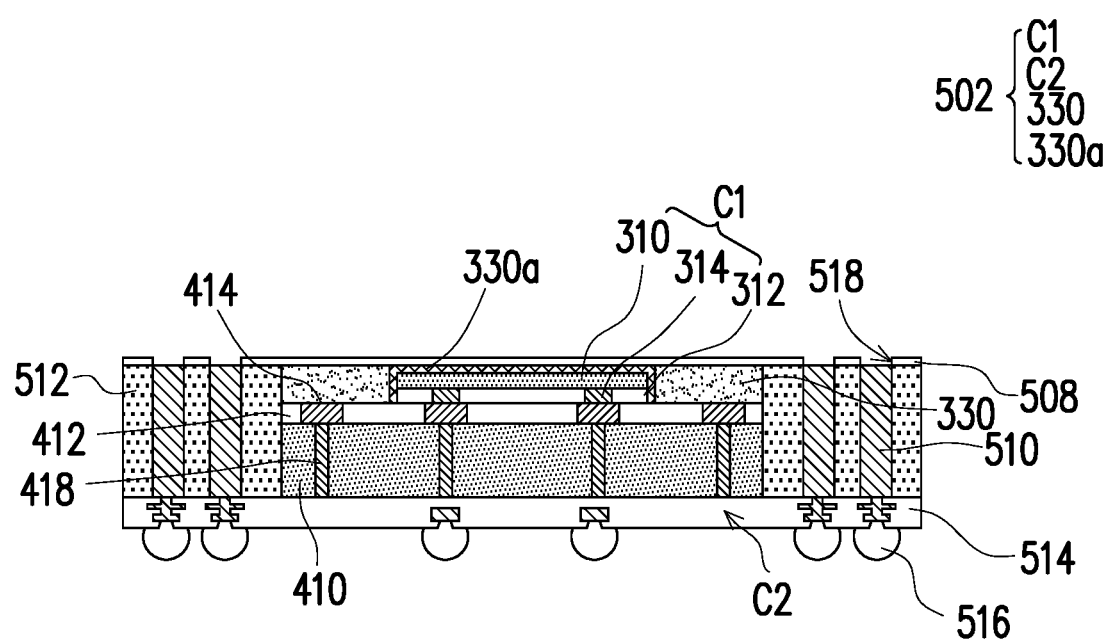
FIG. 8 is a schematic view showing a semiconductor structure in accordance with some embodiments.

It is noted that the protection layer 330 is exemplified as a single layer, but the disclosure is not limited thereto. In some alternative embodiments, as shown in FIG. 8, another protection layer 330a is formed between the protection layer 330 and the chip C1. In other words, the protection layer includes a first layer such as the protection layer 330 and a second layer such as the protection layer 330a. In some embodiments, the protection layer 330a is formed on each of the chips C1, and after bonding to the chip C2 (or a wafer including a plurality of chips C2), the protection layer 330 is formed to encapsulate the chip C1, and optionally grinding the protection layer 330 and the protection layer 330a to form the protection layer. In some embodiments, the material of the protection layer 330a is similar to that of the protection layer 130 of FIG. 2B, and a material of the protection layer 330a is different from a material of the protection layer 330. In some embodiments, the protection layer 330 includes an encapsulating material such as a molding compound (for example, epoxy molding compound (EMC)), a molding underfill, a resin, an epoxy, and/or the like, and may be formed by a molding process.

In some embodiments, the substrate of the chip mounted on the carrier is thinned by the etching process rather than a grinding process. Therefore, the damage to inner structure of the bonded unit due to the grinding process is prevented. Accordingly, the property of the package formed from the bonded structure may be improved. In addition, in some embodiments, the protection layer may be served as the encapsulant aside the chip (i.e., chip C1) and thus the encapsulant is not additionally formed, and the cost or time for the manufacture of semiconductor structure is not increased.

Figure 9E:
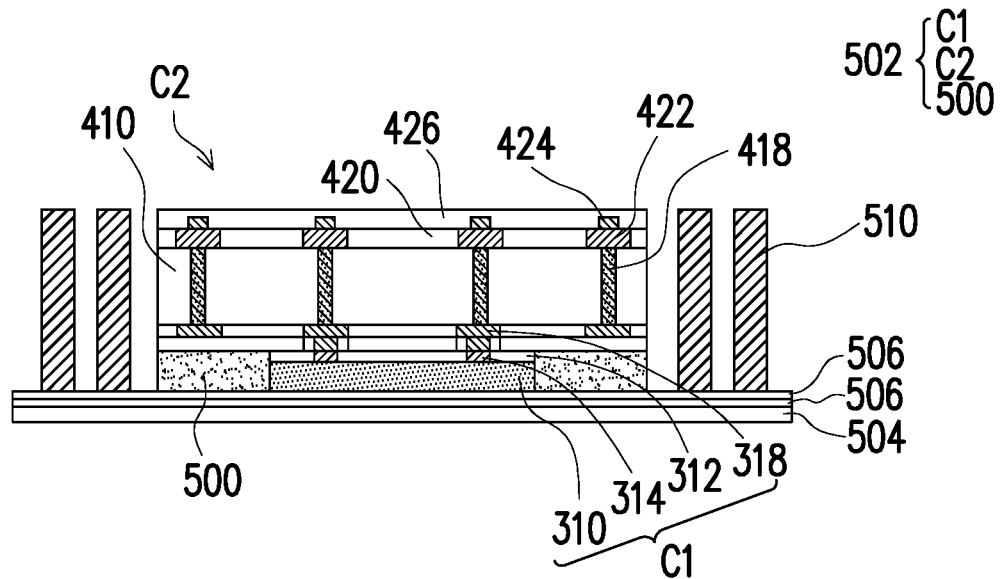

FIG. 9A through FIG. 9G are schematic views showing a method of forming a semiconductor structure in accordance with some embodiments. Referring to FIG. 9A, a wafer W is provided. The wafer W includes a substrate 410, a dielectric layer 420, a plurality of conductive patterns 422 in the dielectric layer 420 and a plurality of through vias 418 formed in the substrate 410 and electrically connected to the conductive patterns 422. In addition, the wafer W further includes a plurality of conductive patterns 424 and a dielectric layer 426, and the conductive patterns 424 are formed in and covered by the dielectric layer 426 to electrically connect to the conductive patterns 422.

Referring to FIG. 9B, the wafer W is placed on a carrier 428, and the substrate 410 is grinded until the through vias 418 are exposed. In some embodiments, the dielectric layer 426 is disposed between the carrier 428 and the substrate 410, and a surface of the wafer W is covered by the carrier 428. The carrier 428 is, for example, a glass substrate. Then, a plurality of pads 414 in a dielectric layer 430 is formed on and electrically connected to some of the through vias 418, and a dielectric layer 412 is formed on the dielectric layer 430.

Referring to FIG. 9C, a chip C1 is bonded to the wafer W, and an encapsulating material 500 is formed over the wafer W to encapsulate the chip C1. The chip C1 includes a substrate 310, a dielectric layer 312 and a plurality of pads 314. In addition, the chip C1 further includes bumps 318 formed on the pads 314 and protruding from the dielectric layer 312.

Referring to FIG. 9D, the substrate 310 of the chip C is thinned by an etching process EP. In some embodiments, during the etching process EP, the surface of the wafer W is covered by the carrier 428. In some embodiments, although the substrate 410 of the wafer W has similar etching selectivity with respect to the substrate 310 of the chip C1 when using an etchant to etch the substrate 310 of the chip C1, the substrate 410 of the wafer W is not damaged by the etching process EP since the substrate 410 is protected by the carrier 428. In other words, in some embodiments, the carrier 428 is used as a protection layer during the thinning process.

Referring to FIG. 9E, the bonded structure of FIG. 9D is diced to form a plurality of bonded unit 502 and de-bonded from the carrier 428. The bonded unit 502 includes the chip C1, the encapsulating material 500 covering the chip C1 and a chip C2 diced from the wafer W. Then, the bonded unit 502 is placed on a carrier 504 with a plurality of conductive posts 510 formed thereon. In some embodiments, the chip C1 is disposed between the chip C2 and the carrier 504.

Figure 9F:
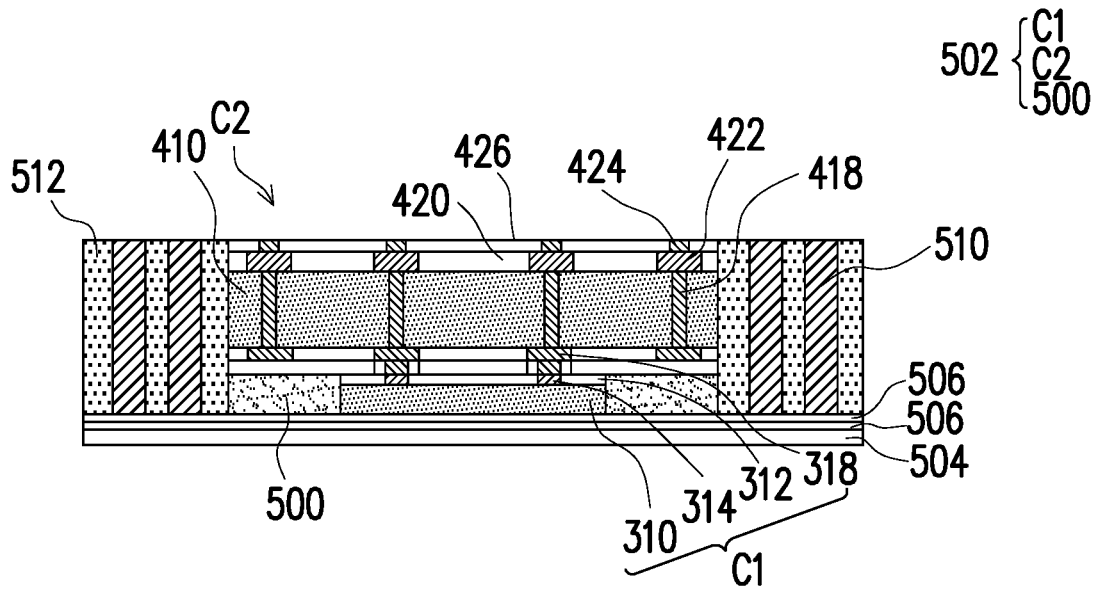

Referring to FIG. 9F, the bonded unit 502 is encapsulated (molded) in an encapsulating material 512, and the encapsulating material 512 and the dielectric layer 426 are grinded until the top surfaces of the conductive patterns 424 and the conductive posts 510 are exposed.

Figure 9G:
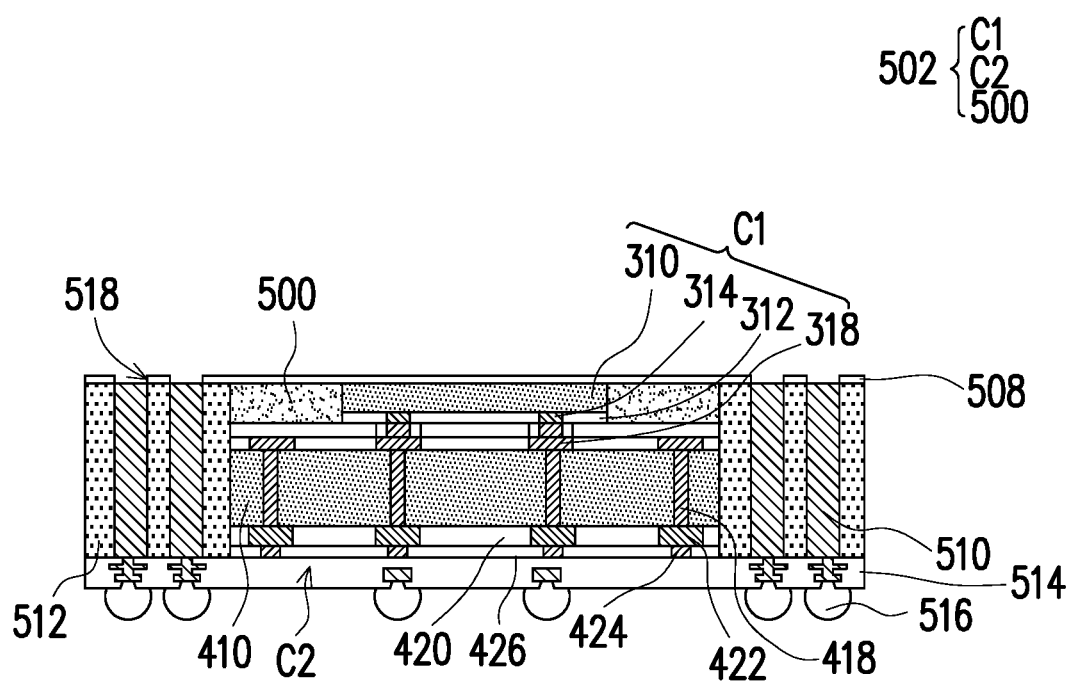

Referring to FIG. 9G, a redistribution circuit structure 514 is formed on the top surfaces of the conductive posts 510, the encapsulating material 512 and the conductive patterns 424. Then, the formed structure is de-bonded from the carrier 504, and a plurality of conductive terminals 516 and a plurality of contact openings 518 in the dielectric layer 508 are formed, so as to form a package.

In some embodiments, by using the carrier as a protection layer for the substrate of the wafer, the substrate of the chip bonded to the wafer is thinned by the etching process rather than a grinding process. Therefore, the damage to inner structure of the bonded structure due to the grinding process is prevented. Accordingly, the property of the package formed from the bonded structure may be improved. In addition, since the carrier serves as the protection layer, the protection layer is not additionally formed, and the cost or time for the manufacture of semiconductor structure is not increased.

In accordance with some embodiments of the disclosure, a semiconductor structure includes a first die, a second die, a first encapsulating material and a protection layer. The first die includes a first substrate. The second die is bonded to the first die and includes a second substrate. The first encapsulating material encapsulates the first die. The protection layer is disposed on a sidewall of the first substrate and between the first substrate and the first encapsulating material, wherein a material of the protection layer is different from materials of the second substrate and the first encapsulating material.

In accordance with some embodiments of the disclosure, a method of forming a semiconductor structure includes the following steps. A first substrate is provided. A protection layer is formed to cover an exposed surface of the first substrate. A second substrate is provided, wherein a material of the protection layer is different from a material of the second substrate. The first substrate and the second substrate are bonded. The second substrate is thinned by an etching process while the first substrate is protected by the protection layer.

In accordance with some embodiments of the disclosure, a method of forming a semiconductor structure includes the following steps. A first die is provided, wherein the first die includes a first substrate. A protection layer is formed on an exposed surface of the first substrate. A wafer is provided, wherein the wafer includes a second substrate and a plurality of die areas, wherein a material of the protection layer is different from a material of the second substrate. The first die is bonded to one of the plurality of die areas of the wafer to form a bonded structure. The second substrate is thinned by an etching process while the first substrate is protected by the protection layer. The bonded structure is diced to form a bonded unit, wherein the bonded unit includes the first die and a second die diced from one of the plurality of die areas of the wafer. The bonded unit is placed onto a carrier. An encapsulating material is formed to encapsulate the bonded unit. A planarization process is performed on the encapsulating material and the bonded unit. The bonded unit is debonded from the carrier.

In accordance with some embodiments of the disclosure, a semiconductor structure includes a first substrate including a first pad thereover, a second substrate including a bump thereover and a dielectric material. The first pad includes an inner portion and an outer portion being higher than and surrounding the inner portion. The bump is bonded to the inner portion and surrounded by the outer portion. The dielectric material is disposed between the first substrate and the second substrate to encapsulate the first pad and the bump.

In accordance with some embodiments of the disclosure, a semiconductor structure includes a first die, a second die, a first encapsulating material and a protection layer. The first die includes a first substrate. The second die is bonded to the first die and includes a second substrate. The first encapsulating material encapsulates the first die. The protection layer is disposed on a sidewall of the first substrate and between the first substrate and the first encapsulating material without extending onto the second die. A material of the protection layer is different from materials of the second substrate and the first encapsulating material.

In accordance with some embodiments of the disclosure, a semiconductor structure includes a first die, a second die, a protection layer, a first encapsulating material, a redistribution circuit structure and a plurality of conductive terminals. The first die includes a first substrate. The second die is bonded to a first surface of the first die and includes a second substrate. The protection layer is disposed on a sidewall and a second surface opposite to the first surface of the first substrate. The first encapsulating material encapsulates the first die and the protection layer, wherein a material of the protection layer is different from a material of the first encapsulating material. The redistribution circuit structure is disposed over the first die and the second die. The conductive terminals are disposed over and electrically connected to the redistribution circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first die, comprising a first substrate;
   a second die, having a surface, a first portion of the surface bonded to the first die and comprising a second substrate;
   a first encapsulating material, encapsulating the first die and in direct contact with a second portion of the surface of the second die;
   a protection layer, disposed on a sidewall of the first substrate and between the first substrate and the first encapsulating material, wherein a material of the protection layer is different from materials of the second substrate and the first encapsulating material;
   a second encapsulating material, encapsulating the first encapsulating material and the second die; and
   a plurality of through vias, extending through the second encapsulating material, wherein the through vias are physically separated from the first encapsulating material.

2. The semiconductor structure according to claim 1, wherein the first substrate and the second substrate are silicon substrates.

3. The semiconductor structure according to claim 1, wherein the material of the protection layer comprises silicon oxide, silicon nitride or combinations thereof.

4. The semiconductor structure according to claim 1, wherein the protection layer is in direct contact with the first substrate.

5. A semiconductor structure, comprising:
   a first die, comprising a first substrate;
   a second die, bonded to the first die along a first direction and in direct contact with a first surface of the first die and comprising a second substrate;
   a protection layer, disposed on a sidewall of the first die;
   a first encapsulating material encapsulating the first die and a sidewall of the protection layer, wherein a material of the protection layer is different from a material of the first encapsulating material, a first surface of the protection layer is coplanar with the first surface of the first die along a second direction perpendicular to the first direction;
   a second encapsulating material, encapsulating the first encapsulating material and the second die; and
   a plurality of through vias, extending through the second encapsulating material, wherein the through vias are physically separated from the first encapsulating material.

6. The semiconductor structure according to claim 5, wherein the protection layer is in direct contact with the first substrate.

7. The semiconductor structure according to claim 5, wherein the first surface of the protection layer is further flush with a surface of the first encapsulating material along the second direction.

8. The semiconductor structure according to claim 5, wherein a second surface opposite to the first surface of the protection layer is flush with surfaces of the first encapsulating material and the second encapsulating material along the second direction.

9. The semiconductor structure according to claim 5, wherein the first encapsulating material is in direct contact with the second die.

10. The semiconductor structure according to claim 5, wherein a material of the protection layer is different from a material of the second substrate.

11. The semiconductor structure according to claim 5, further comprising:
wherein first surfaces of the second encapsulating material and the through vias are coplanar with a second surface opposite to the first surface of the protection layer and a first surface of the first encapsulating material along the second direction.

12. The semiconductor structure according to claim 11, wherein second surfaces opposite to the first surfaces of the second encapsulating material and the through vias are coplanar with a surface of the second die.

13. The semiconductor structure according to claim 5, wherein the protection layer is continuously disposed on a sidewall and a second surface opposite to the first surface of the first die.

14. A semiconductor structure, comprising:
a first substrate comprising a first pad at a first surface of the first substrate;
a second substrate comprising a second pad, wherein the second pad is bonded to the first pad;
a protection layer, disposed on a sidewall of the first substrate and a second surface opposite to the first surface of the first substrate;
a molding compound, encapsulating the first substrate and the protection layer;
an encapsulant, encapsulating the second substrate and the molding compound; and
a plurality of through vias, extending through the encapsulant, wherein the through vias are physically separated from the molding compound.

15. The semiconductor structure according to claim 14, wherein the protection layer is in direct contact with the first substrate.

16. The semiconductor structure according to claim 14, wherein a material of the protection layer is different from a material of the second substrate.

17. The semiconductor structure according to claim 14, wherein a surface of the protection layer is flush with an interface between the first pad and the second pad.

18. The semiconductor structure according to claim 14, wherein the protection layer is continuously disposed on the second surface and the sidewall of the first substrate.

19. The semiconductor structure according to claim 14 further comprising a first dielectric layer being aside the first pad and a second dielectric layer being aside the second pad and bonded to the first dielectric layer.

20. The semiconductor structure according to claim 14, wherein an entire sidewall of the protection layer is covered by the molding compound.

* * * * *